(12) United States Patent
West et al.

(10) Patent No.: US 11,476,795 B2
(45) Date of Patent: Oct. 18, 2022

(54) SOLAR POWER FORECASTING

(71) Applicant: Commonwealth Scientific and Industrial Research Organisation, Acton (AU)

(72) Inventors: Sam West, Acton (AU); Ryan Lagerstrom, Acton (AU); Changming Sun, Acton (AU); Rongxin Li, Acton (AU); Joel Wong, Acton (AU)

(73) Assignee: Commonwealth Scientific and Industrial Research Organisation, Acton (AU)

( * ) Notice: Subject to any disclaimer, the term of this patent is extended or adjusted under 35 U.S.C. 154(b) by 796 days.

(21) Appl. No.: 16/098,977

(22) PCT Filed: May 11, 2017

(86) PCT No.: PCT/AU2017/050433
§ 371 (c)(1),
(2) Date: Nov. 5, 2018

(87) PCT Pub. No.: WO2017/193172
PCT Pub. Date: Nov. 16, 2017

(65) Prior Publication Data
US 2019/0158011 A1    May 23, 2019

(30) Foreign Application Priority Data

May 11, 2016  (AU) ................................ 2016901760
May 24, 2016  (WO) ................ PCT/AU2016/050396

(51) Int. Cl.
*H02S 10/20*      (2014.01)
*G01W 1/10*      (2006.01)
(Continued)

(52) U.S. Cl.
CPC ............ *H02S 10/20* (2014.12); *G01J 1/0228* (2013.01); *G01J 1/4204* (2013.01);
(Continued)

(58) Field of Classification Search
CPC .......... H02S 10/20; H02S 10/00; H02S 50/00; H01L 31/042; G01J 1/4204; G01J 1/0228;
(Continued)

(56) References Cited

U.S. PATENT DOCUMENTS

2015/0301226 A1    10/2015  Sun et al.

FOREIGN PATENT DOCUMENTS

EP          2645135 A1 *  10/2013  ........... H04N 13/204
WO   WO-2015104281 A1 *   7/2015  .............. G01W 1/12

OTHER PUBLICATIONS

3D Cloud detection and tracking system for solar forecast using multiple sky imagers, Solar Energy vol. 118 (2015) p. (496-519 ) (Year: 2015).*

(Continued)

*Primary Examiner* — Natalie Huls
*Assistant Examiner* — Michael J Singletary
(74) *Attorney, Agent, or Firm* — Paul Teng

(57) ABSTRACT

A method for determining a level of solar radiation at a point of interest (POI). Multiple sky images are captured by a distributed network of digital cameras. Sun location parameters are determined. A three-dimensional (3D) sky model is generated based on the sky images. Generating the 3D sky model includes generating 3D object data based on the sky images to model one or more objects in a region of sky, and generating position data to model a position of the one or more objects in the region of sky. A level of solar radiation at the POI is determined based on the position data and 3D (Continued)

object data of the 3D sky model and the sun location parameters.

20 Claims, 23 Drawing Sheets

(51) Int. Cl.
| | |
|---|---|
| *G01W 1/12* | (2006.01) |
| *G06N 5/00* | (2006.01) |
| *G06N 20/20* | (2019.01) |
| *H02S 10/00* | (2014.01) |
| *H01L 31/042* | (2014.01) |
| *H02S 50/00* | (2014.01) |
| *G01J 1/42* | (2006.01) |
| *G01J 1/02* | (2006.01) |

(52) U.S. Cl.
CPC .............. *G01J 1/4214* (2013.01); *G01W 1/10* (2013.01); *G01W 1/12* (2013.01); *G06N 5/003* (2013.01); *G06N 20/20* (2019.01); *H01L 31/042* (2013.01); *H02S 10/00* (2013.01); *H02S 50/00* (2013.01); *F24S 2201/00* (2018.05); *G01J 2001/4266* (2013.01); *Y02E 10/50* (2013.01)

(58) Field of Classification Search
CPC  G01J 1/4214; G01J 2001/4266; G06N 5/003; G06N 20/20; G01W 1/12; G01W 1/10; Y02E 10/50; Y02E 70/30; F24S 2201/00
See application file for complete search history.

(56) References Cited

OTHER PUBLICATIONS

Clouds in the cloud, Computer Vision—ACCV 2014, Apr. 17, 2015, p. 659-674 (Year: 2015).*
A method for cloud detection and opacity classification based on ground based sky imagery, Atmos. Meas. Tech., 5, 2881-2892, 2012 (Year: 2012).*
International Search Report dated Jul. 24, 2017 in connection with International Patent Application No. PCT/AU2017/050433 filed May 11, 2017.
Written Opinion dated Jul. 24, 2017 for counterpart International Patent Application No. PCT/AU2017/050433 filed May 11, 2017.
International Preliminary Report on Patentability dated Dec. 11, 2017 for counterpart International Patent Application No. PCT/AU2017/050433 filed May 11, 2017.
Zhenzhou Peng et al., "3D Cloud Detection and Tracking System for Solar Forecast Using Multiple Sky Imagers", Solar Energy (Aug. 2015), vol. 118, pp. 496-519.
Dmitry Veikherman et al., "Clouds in the Cloud", Computer Vision, ACCV 2014: 12$^{th}$ Asian Conference on Computer Vision (Nov. 1-5, 2014), pp. 659-674.

* cited by examiner

1500

1510 — computing a light path between the POI and a location of the sun based on the sun location parameters 1520 — determining if the one or more objects modelled in the 3D sky model occludes the light path 1530 — determining the level of solar radiation at the POI based on a level of occlusion of the light path by the one or more objects

1610 — generating separate 3D point clouds based on the sky images captured by each pair of digital cameras 1620 — merging separate 3D point clouds to generate a 3D sky model of the region of the sky

Fig. 16

SOLAR POWER FORECASTING

CROSS-REFERENCE TO RELATED APPLICATIONS

The present application is a Section 371 national stage of PCT International Application No. PCT/AU2017/050433 filed May 11, 2017, claiming priority from Australian Provisional Patent Application No 2016901760 filed on 11 May 2016 and PCT Application No PCT/AU2016/050396 filed on 24 May 2016, the content of which is incorporated herein by reference.

TECHNICAL FIELD

This disclosure relates to predicting a level of solar radiation, such as a solar irradiance or power. For example, the predicted solar irradiance can be used for controlling solar power systems.

BACKGROUND

Solar irradiance is a natural resource that is commonly harvested using solar photovoltaics or solar thermal systems. This natural resource is highly intermittent mainly due to clouds occluding the sun. Current systems are often not at the optimal operation point because it is difficult to predict the solar irradiance.

Any discussion of documents, acts, materials, devices, articles or the like which has been included in the present specification is not to be taken as an admission that any or all of these matters form part of the prior art base or were common general knowledge in the field relevant to the present disclosure as it existed before the priority date of each claim of this application.

SUMMARY

A method for determining a level of solar radiation at a point of interest (POI), the method comprising:
 capturing multiple sky images by a distributed network of digital cameras;
 determining sun location parameters;
 generating a three-dimensional (3D) sky model based on the sky images, wherein generating the 3D sky model comprises: generating 3D object data based on the sky images to model one or more objects in a region of sky; and
 generating position data to model a position of the one or more objects in the region of sky;
 determining a level of solar radiation at the POI based on the position data and 3D object data of the 3D sky model and the sun location parameters.

Determining a level of solar radiation at a POI may comprise:
 computing a light path between the POI and a location of the sun based on the sun location parameters;
 determining if the one or more objects modelled in the 3D sky model occludes the light path; and
 determining the level of solar radiation at the POI based on a level of occlusion of the light path by the one or more objects.

The 3D object data may comprise information regarding one or more of the following for each of the one or more objects:
 a continuous 3D surface mesh of the object;
 a continuous 3D volumetric mesh of the object;
 a thickness of the object;
 a 3D shape of the object;
 a volume of the object;
 an optical depth of the object.

The distributed network of digital cameras may comprise multiple pairs or sets of digital cameras capturing sky images of the region of the sky.

The digital cameras in each pair or set of digital cameras may be spaced by between 100 metres and 2 kilometres.

Each pair or set of digital cameras may be spaced by between 2 and 20 kilometres from other pairs or sets of digital cameras in the distributed network of digital cameras.

Generating 3D object data may comprise determining 3D information for each of the one or more objects based on sky images captured by multiple pairs or sets of digital cameras.

Generating 3D object data may comprise aligning the sky images based on the sun location parameters.

The digital cameras in the distributed network of digital cameras may comprise wide-angle or fisheye lenses.

Generating 3D object data may comprise aligning the sky images by 3D rotating the sky images in a fish-eye space.

Generating 3D object data may comprise generating separate 3D models based on the sky images captured by each pair or set of digital cameras.

Generating separate 3D models may comprise generating separate 3D point clouds based on the sky images captured by each pair or set of digital cameras.

Generating 3D object data may further comprise aligning and merging separate 3D models to generate the 3D sky model of the region of the sky.

Merging the separate 3D models may comprise matching features between the separate 3D point clouds.

The separate 3D models may be sparse models, and generating 3D object data may comprise merging separate sparse models on demand to generate a surface or volumetric patch for the region of sky between the POI and the sun.

Generating 3D object data may further comprise resolving conflicting data in overlapping areas of the separate 3D models.

Generating position data may comprise determining a location and an altitude of a base of each of the one or more objects in the region of sky based on the sky images captured by multiple digital cameras.

Generating position data may comprise determining an altitude of each of the one or more objects based on a pixel-shift of each object between sky images.

Generating position data may comprise capturing LiDAR measurements of the region of sky.

Generating the 3D sky model may comprise combining the position data and the 3D object data.

Generating the 3D sky model may comprise:
 determining pixels in the sky images that are below a horizon; and
 masking the pixels in the sky images that are below the horizon.

Generating the 3D sky model may comprise:
 determining pixels in the sky images that correspond to a fixed object; and
 masking the pixels in the sky images that correspond to a fixed object.

Determining the sun location parameters may comprise:
 storing the captured sky images; and
 determining the sun location parameters based on stored sky images captured at different times of a day.

Determining the sun location parameters may comprise:
 fitting a smoothed curve through sun location points determined from the sky images such that an error between the sun location points and a sun azimuth/zenith model of the sun's rotation is minimised.

Determining a level of solar radiation at the POI may comprise:

estimating a future position of each of the one or more objects by extrapolating a past position, volume, optical depth and/or velocity of the object; and forecasting a future level of solar radiation at the POI.

The distributed network of digital cameras may be distributed across a city or geographic region.

The distributed network of digital cameras may comprise digital cameras that communicate with each other via peer-to-peer networking.

The method may comprise generating a control signal to control a solar power system based on the determined level of solar radiation at the POI.

Generating a control signal may comprise one or more of:

generating a control signal to control an inverter output to adjust ramp-rates in an electrical grid;

controlling energy storage charge and discharge rates and timing;

controlling the rate and timing of energy consumption of electrical devices;

controlling electrical devices to provide voltage, frequency and network services to the electrical grid; and controlling a generator to compensate for a reduction of performance caused by a cloud cover reducing level of solar radiation of the solar power system.

A number of sky images captured may be such that an accuracy of the determined level of solar radiation is sufficient for generating a control signal that compensates for a difference between a power demand and a predicted solar power performance.

Capturing the sky images may comprise capturing multiple images at different exposure parameters and combining the multiple images into a single sky image.

The object is a cloud.

The method may further comprise:

determining cloud formation and/or advection parameters based on the 3D sky model; and determining the level of solar radiation based on the cloud formation and/or advection parameters.

Determining a level of solar radiation at a POI may also be based on one or more of the following:

satellite imagery;

numerical weather forecasts;

weather observations; and measurements of distributed solar power generation.

A method for determining a network of digital cameras to estimate a performance of a solar power system, the method comprising:

performing the method as described herein to determine a predicted level of solar radiation;

determining a predicted performance of a solar power system based on the predicted level of solar radiation;

receiving measurement data indicative of the actual performance of the solar power system;

determining a difference between the predicted performance and the actual performance; and determining the network of digital cameras by reducing the difference between the predicted performance and the actual performance.

Determining the network of digital cameras may comprise determining the number and location of digital cameras that reduces the difference between the predicted performance and the actual performance.

A system comprising:

a distributed network of digital cameras to capture multiple sky images; and a processor to:

receive the sky images from the distributed network of digital cameras;

generate a three-dimensional (3D) sky model comprising elevation data and 3D surface data based on the sky images to model one or more objects in a region of sky;

determine sun location parameters; and determine a level of solar radiation at a point of interest (POI) based on the elevation data and 3D surface data of the 3D sky model and the sun location parameters.

A method for predicting solar irradiance comprises:

capturing multiple training sky images by an image sensor;

receiving object location data in relation to the multiple training sky images, the object location data being indicative of a location in the training sky images of an object that may affect the solar irradiance;

determining one or more parameter values based on the object location data, the parameter values being indicative of a relationship between the location of the object and the solar irradiance; and determining a predicted solar irradiance value based on the parameter values.

Capturing the multiple training sky images may be at predetermined locations, orientations and lens configurations of the image sensor. The predetermined locations, orientations and lens configurations of the image sensor may be one constant location, orientation and lens configuration of the image sensor.

Receiving the object location data may comprise:

generating a display of the multiple training sky images; and receiving the object location data as user input data in relation to the multiple training sky images, the user input data being indicative of a location in the training sky images of an object that may affect the solar irradiance.

Capturing multiple training sky images may comprise capturing multiple training sky images for different positions of the sun. The object that may affect the solar irradiance may be the sun and the object location data is indicative of a location of the sun in the multiple training sky images. The one or more parameter values may be indicative of a location, orientation and lens configuration of the image sensor. Determining the predicted solar irradiance value may comprise determining a predicted position of the sun at a prediction time based on the parameter values and determining the predicted solar irradiance based on the predicted position of the sun.

It is an advantage that the parameter values can be determined using a small number of identified sun locations, allowing the fast and accurate setup of a model for a camera of arbitrary fisheye characteristics, tilt, and orientation.

The object that may affect the solar irradiation may be a cloud cover and the object location data maybe indicative of a classification of pixels of the multiple training sky images, the classification being in relation to a cloud cover in the sky images. The one or more parameter values may be parameter values of a supervised learning classifier based on the user input data. Determining the predicted solar irradiance value may comprise:

capturing a test sky image;

applying the supervised learning classifier to a pixel of the test sky image to determine a classification in relation to a cloud cover for the pixel, and determining the predicted solar irradiance value based on the classification.

It is an advantage that the supervised learning classifier classifies clouds accurately. In particular, the supervised learning classifier classifies cloud edges and thin and distant clouds accurately. The human-based training further allows the use of inexpensive cameras with low dynamic range, lossy compression and low resolution.

The classification in relation to the cloud cover may be based on a set of three labels including thick, medium and thin, or a set of two labels including cloud and clear sky.

The supervised learning classifier may be an ensemble classifier comprising multiple-sub classifiers, and determining the classification may comprise applying the ensemble classifier to a pixel of the test sky image to calculate for each of the multiple sub-classifiers an output classification and determining the classification for the pixel based on the output classification of each of the multiple sub-classifiers.

The ensemble classifier may be a decision forest and the sub-classifiers are decision trees.

Determining the ensemble classifier may comprise determining nodes and edges of the decision forest.

Determining the classification in relation to a cloud cover for the pixel may comprise determining the classification based on a Red-Blue Ratio classifier.

It is an advantage that the Red-Blue Ratio classifier classifies overcast and dark clouds accurately. As a result, combining the Red-Blue Ratio classifier with the ensemble classifier leads to accurate classification of most clouds.

The method may further comprise:
capturing multiple test sky images; and
applying the supervised learning classifier to pixels of the multiple test sky images to determine a classification in relation to a cloud cover for each of the multiple test sky images;
wherein determining the predicted solar irradiance value comprises determining a movement of cloud pixels and determining the predicted solar irradiance value based on the movement of the cloud pixels.

The advantage of determining cloud movement is that future shading events can be predicted accurately.

Determining the movement may comprise determining a motion vector of the pixels classified as having a cloud cover that is above a predetermined threshold.

The method may further comprise determining a temporal extrapolation based on the motion vector, wherein determining the predicted performance comprises determining a predicted sun occlusion event based on the extrapolation.

Determining the predicted sun occlusion event may comprise determining a predicted time value or a predicted magnitude value or both for the predicted sun occlusion event.

Determining the motion vector of the pixels may comprise determining the motion vector for each pixel separately.

The advantage of determining the motion vector for each pixel separately is that the method can capture any number of independently moving clouds/cloud layers and predict their impact on irradiance separately.

The method may further comprise:
capturing multiple test sky images; and
applying the supervised learning classifier to pixels of the multiple test sky images to determine a classification in relation to a cloud cover in the sky images for the pixels of each of the multiple test sky images,
wherein determining the predicted solar irradiance value comprises determining cloud formation based on the classification and determining the predicted solar irradiance value based on the cloud formation.

It is an advantage that shading events that are caused by newly formed clouds can be predicted accurately when the cloud formation warnings are available.

The method may further comprise:
determining a cloud altitude based on captured test sky images;
determining a characteristic value of a shadow cast by a cloud at the cloud altitude,
wherein determining the predicted solar irradiance value comprises determining the predicted solar irradiance value based on the shadow.

Determining the predicted solar irradiance value may comprise determining one or more of:
presence of clouds within a predetermined viewing angle of sun;
shading-time predictions; and
solar power generation.

A method for operating a network of multiple cameras to predict irradiance comprises:
performing the above method for each of the multiple cameras of the network; and
combining the classifications or predictions to generate location data indicative of a cloud cover and cloud characteristics for the area covered by the multiple cameras.

The method may further comprise determining a predicted performance of a solar power system based on the predicted solar irradiance value.

The method may further comprise generating a control signal to control the solar power system based on the predicted performance.

The method may further comprise:
receiving measurement data indicative of the actual performance of the solar power system;
determining a difference between the predicted performance and the actual performance;
determining configuration parameters of the system to reduce the difference between the predicted performance and the actual performance.

The configuration parameters may comprise position and orientation of the image sensor.

Generating a control signal may comprise one or more of:
generating a control signal to control an inverter output to adjust ramp-rates in an electrical grid;
controlling energy storage charge and discharge rates and timing;
controlling the rate and timing of energy consumption of electrical devices;
controlling electrical devices to provide voltage, frequency and network services to the electrical grid; and
controlling a generator to compensate for a reduction of performance caused by a cloud cover reducing irradiance of the solar power system.

It is a problem with existing methods that there is a delay between a change in performance of a solar power system and the adaptation of the electrical grid in response to the change of performance. Therefore, it is an advantage that the overall stability and reliability of the grid can be increased when generators are started or inverters limited before the actual performance of the solar power system changes. That is, the generators and inverters are controlled based on the predicted performance instead of the actual performance. Similarly, battery storage charge and discharge rates can be optimised, demand-response actions can be taken, and ancillary services can be provided to the market more effectively using the predicted solar performance.

Capturing the training sky images may comprise capturing multiple images at different exposure parameters and combining the multiple images into a single training sky image.

Determining a predicted performance of the solar power system may comprise determining a predicted performance of the solar power system based on historical performance data.

The image sensor may generate the training sky images or the test sky images or both with an analog to digital resolution of 8 bit or less.

It is an advantage that 8 bit cameras are less expensive than high dynamic range cameras and capturing training sky images to determine a predicted performance results in a satisfactory accuracy even at the low resolution of 8 bit or less. It is also an advantage that compressed images from 8 bit cameras are smaller in size and can be transmitted or stored more quickly and cheaply than images from high dynamic range cameras.

The image sensor may generate the training sky images or the test sky images or both with a spatial resolution of 1024×768 pixels or less.

The method may further comprise repeating the steps of capturing multiple training sky images, generating a display, receiving user input and determining one or more parameter values for multiple image sensors located across a prediction region, wherein determining the predicted solar irradiance comprises determining the predicted solar irradiance at a prediction location within the prediction region based on the parameter values determined for each of the multiple image sensors.

The camera network is advantageous because it extends the single-camera forecast horizon of about 30 minutes, to several hours, and expands the area covered from a 10 km radius to hundreds of square kilometres using multiple cameras, allowing the network to out-compete longer-term approaches such as satellite cloud prediction, for a fraction of the capital cost, but with higher spatial resolution and temporal frequency. Preferably, the camera network collects imagery every 1 second, at a 10 m grid resolution, whereas satellites will typically provide images every 15 minutes at around a 10 km grid.

Determining a predicted solar irradiance value may comprise determining a predicted direct normal irradiance for individual collectors comprising heliostats, linear Fresnel, parabolic trough, or dish collectors in a solar thermal facility, and the method may further comprise per collector selection and targeting control to optimise irradiance control and irradiance slew rate over a receiver surface.

Determining a predicted solar irradiance value may comprise determining a predicted direct normal irradiance for individual collectors comprising heliostats, linear Fresnel, parabolic trough, or dish collectors in a solar thermal facility, and the method may comprise automated or manual control to optimise plant output, short term operability or long term operability.

Software, when executed by a computer, causes the computer to perform the above method.

A computer system for predicting solar irradiance comprises:
 a first input port to receive from an image sensor captured multiple first training sky images;
 a second input port to receive object location data in relation to the multiple first training sky images, the object location data being indicative of a location in the training sky images of an object that may affect the solar irradiance;
 a processor
  to determine one or more parameter values based on the object location data, the parameter values being indicative of a relationship between the location of the object and the solar irradiance, and
  to determine a predicted solar irradiance value based on the parameter values.

The computer system may further comprise a display device to generate a display of the multiple first training sky images, wherein the second input port is to receive the object location data as user input data in relation to the multiple first training sky images, the user input data being indicative of a location in the training sky images of an object that may affect the solar irradiance.

The image sensor may be configured to generate the training sky images or the test sky images or both with an analog to digital resolution of 8 bit or less.

The image sensor maybe configured to generate the training sky images or the test sky images or both with a spatial resolution of 1024×768 pixels or less.

The image sensor may be configured to generate images using lossy compression.

A camera is used for capturing training sky images to determine a predicted solar irradiance value, wherein the camera is configured to generate the training sky images with an analog to digital resolution of 8 bit or less.

A camera that is configured to generate images with an analog to digital resolution of 8 bit or less is used for capturing training sky images and of a display and input device for receiving user input data in relation to the training sky images, the user input data being indicative of a location in the training sky images of an object that may affect the solar irradiance to determine a predicted solar irradiance value based on the multiple training sky images and the user input data.

The number of captured training sky images may be such that the accuracy of the predicted performance is sufficient for generating a control signal that compensates for a difference between a power demand and the predicted solar power performance.

A camera that is configured to generate images with an analog to digital resolution of 8 bit or less is used for capturing sky images that serve as a test input to a supervised learning classifier to predict solar irradiance.

The supervised learning classifier may be an ensemble classifier.

The camera may be further configured to generate images with a spatial resolution of 1024×768 pixels or less.

The camera may be configured to generate images using lossy compression.

Multiple cameras may be used as stated above in a network of cameras located across a prediction region to determine a predicted solar irradiance value for a location around the prediction region.

Preferably, the network comprises more than 5 cameras. More preferably, the network comprises more than 10 cameras. Even more preferably, the network comprises between 10 and 20 cameras covering a visible ground-area of several hundred square kilometres or more.

The camera may be configured to generate the training sky images with one or more of:
 an analog to digital resolution of 8 bit or less;
 a pixel resolution of 1024×768 or less; and
 use of a lossy compression.

A method for determining a network of image sensors to estimate a performance of a solar power system comprises:

performing the above method to determine a predicted solar irradiance;

determining a predicted performance of the solar power system based on the predicted solar irradiance;

receiving measurement data indicative of the actual performance of the solar power system;

determining a difference between the predicted performance and the actual performance; and determining the network of image sensors by reducing the difference between the predicted performance and the actual performance.

Determining the network of image sensors may comprise determining the number and location of image sensors that reduces the difference between the predicted performance and the actual performance.

A method for solar irradiance prediction comprises:

capturing by a camera training sky images; and determining a predicted solar irradiance value based on the training sky images, wherein the camera has an analog to digital resolution of 8 bit or less.

A method for solar irradiance prediction comprises:

capturing multiple training sky images by a camera with an analog to digital resolution of 8 bit or less;

receiving from a display and input device user input data in relation to the multiple training sky images, the user input data being indicative of a location in the training sky images of an object that may affect the solar irradiance; and determining a predicted solar irradiance value based on the multiple training sky images and the user input data.

A method for solar irradiance prediction comprises:

capturing by a camera with an analog to digital resolution of 8 bit or less sky images; and applying the sky images to a test input of a supervised learning classifier to predict solar irradiance.

A method for estimating a performance of a solar power generation system comprises:

capturing multiple first training sky images by an image sensor for different positions of the sun;

generating a display of the multiple first training sky images;

receiving user input data in relation to the multiple first training sky images, the user input data being indicative of a location of the sun in the multiple first training sky images;

determining one or more parameter values based on the user input data, the parameter values being indicative of a location, orientation and lens configuration of the image sensor;

determining a predicted position of the sun at a prediction time based on the parameter values;

determining a predicted performance of the solar power generation system based on the predicted position of the sun; and generating a control signal to control the solar power system based on the predicted performance.

A solar power generation system comprises:

a supervised training module of a localised sun location model, a prediction module of the sun's position a prediction module of a performance of the solar power generation system; and a control module of an output of the solar power generation system.

A method for estimating a performance of a solar power generation system comprises:

capturing of multiple second training sky images by the image sensor for different cloud cover;

generating a display of multiple second training sky images;

receiving user input data indicative of a classification of pixels of the multiple second training sky images, the classification being in relation to a cloud cover in the sky images;

determining an ensemble classifier based on the user input data, the ensemble classifier comprising multiple sub-classifiers;

capturing a test sky image;

applying the ensemble classifier to a pixel of the test sky image to calculate for each of the multiple sub-classifiers an output classification;

determining a classification as cloud or clear sky for the pixel based on the output classification of each of the multiple sub-classifiers;

determining a predicted performance of the solar power generation system based on the classification as cloud or clear sky; and generating a control signal to control the solar power system based on the predicted performance.

A solar power generation system comprises:

a supervised training module of a cloud pixel classification model using an ensemble classifier; and a prediction module of performance based on the classification Training sky images are a subset of the sky images taken by a camera which are used for training and calibrating various models and parameters which allow the forecasting system to operate or forecast more accurately. For example, training sky images can be displayed to allow a user to manually identify objects of interest, so a fully automatic object identifier can be trained to identify similar objects in other images.

Test sky images are images which are processed automatically by the system to provide forecasts and other information, using the data and models obtained from the training process.

Optional features described above in relation to one or more of the aspects of method, system, software and use are also optional features of the other aspects.

Throughout this specification the word "comprise", or variations such as "comprises" or "comprising", will be understood to imply the inclusion of a stated element, integer or step, or group of elements, integers or steps, but not the exclusion of any other element, integer or step, or group of elements, integers or steps.

BRIEF DESCRIPTION OF DRAWINGS

An example will now be described with reference to:

FIG. 15 illustrates a method for determining the level of solar radiation at the POI.

FIG. 16 illustrates a method for generating 3D object data.

DESCRIPTION OF EMBODIMENTS

Figure 1A:
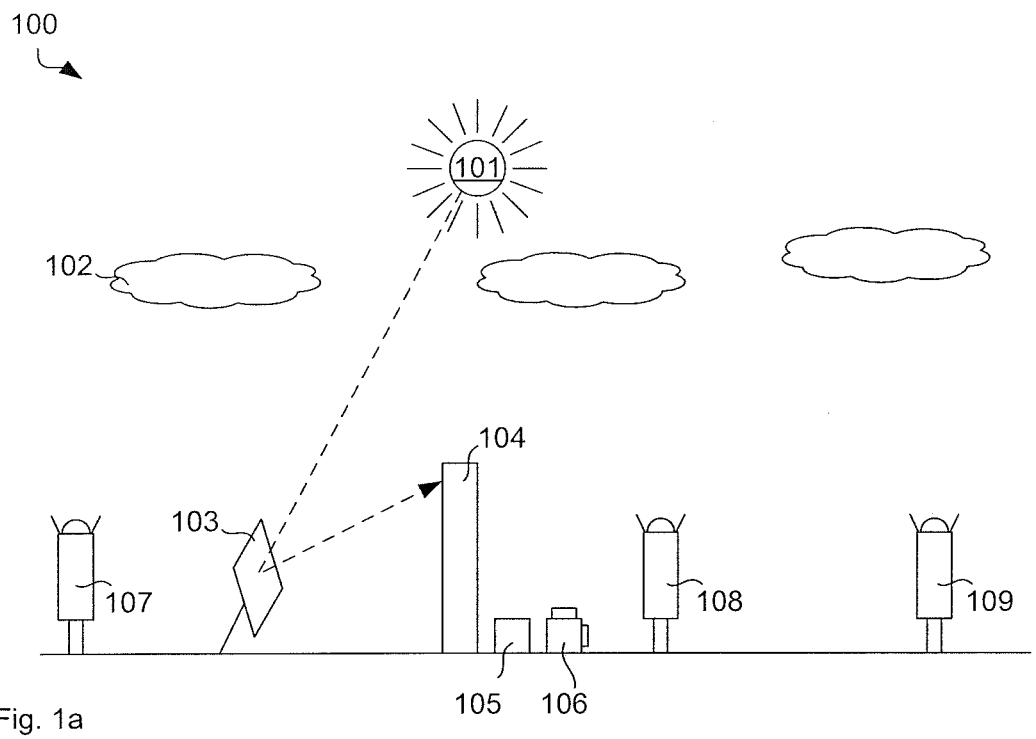
FIG. 1a illustrates a solar system.

This disclosure provides sun location models and optimisation algorithms, enabling the sun's location to be accurately tracked in a sky image. The model can be trained and optimised using a small number of human identified or computer identified sun locations, allowing the fast and accurate setup of a model for a camera of arbitrary fisheye characteristics, tilt, and orientation. This disclosure further provides lens distortion and calibration algorithms, modelling location and movement in a distorted camera image.

This disclosure further provides a cloud classification model allows the identification of clouds in a sky image using a supervised machine learning model which is trained on a small number of human-identified cloud and sky pixels. This model may be combined with a standard pixel red-blue-ratio model to improve the classification accuracy beyond the performance of either model separately, especially on low resolution, lossily-compressed, limited dynamic range images, such as from the inexpensive camera hardware, such as hardware comprising a colour resolution of 8-bit including JPEG cameras and other formats.

Cloud presence evaluation aggregates cloud pixel classification data and provides features which indicate the presence or absence of clouds and estimates the likelihood of shade events to occur in the near future.

Cloud movement identification allows cloud motion vectors to be estimated from a sequence of images. This may use optical flow algorithms and dense optical flow algorithms to compare the position of clouds between two frames of a sky image and estimate their movement.

Cloud projection algorithms allow predictions of a cloud's future position and velocity to be made. These custom algorithms use the cloud motion vectors (from previous step) to efficiently estimate the future position of every pixel in the image at a given time in the future, across the distortion-correct fisheye space. It identifies cloudy-classified pixels which will pass within a given distance of the sun, and are therefore likely to cause shading, and extracts a number of forecast features from them. These features are stored and used in future steps to provide irradiance and shade-timing forecasts.

Shade-event timing warnings, which provide a binary forecast of upcoming shade events and times. These warnings can be given with a range of adjustable biases, to allow a range of forecasts, from very conservative (avoiding shade-event misses), to very aggressive (only predicting shade events with high probability).

Irradiance predictions may forecast both the timing and magnitude of irradiance decrease, during a shading event.

Cloud formation (advection) detection uses computer vision techniques to detect clouds forming (i.e. appearing from a clear sky rather than moving in from across the image) near the sun. Probabilistic warnings of cloud formation can be provided using this information. These warnings are an important addition to the cloud movement vector information, which generally can't predict shade events caused by clouds which form from a clear sky.

Cloud height stereography uses concurrent images from two or more cameras spaced an appropriate distance apart, to match cloud pixel information in all images and determine their height using stereography.

Wide-area shadow projection and forecasting uses cloud height measurements to build a 3D model of cloud locations to be constructed, and ray-tracing techniques to be used to extrapolate the position of shadows on the ground.

Multi-camera forecast combination combines the above techniques, and applies them to multiple concurrent, real-time images from a network of skycams spaced across a region (like a city) to provide a seamless region-wide forecast, providing very high resolution forecasts with much longer time-horizons and higher accuracy than a single camera.

Photovoltaic inverter output shaping and ramp rate limiting may use skycam observations and forecasts, that is predicted irradiance values, to control a number of solar inverters, limiting their output to minimise ramp-rates in an electrical grid.

Provided herein is a tool which evaluates performance profiles of single and multi-camera irradiance forecasts and allows optimal placement and spacing of cameras in a multi-camera network to ensure the area is adequately covered in all cloud conditions, and that forecast errors in chosen areas can be evaluated.

The tool may take shading, irradiance and/or solar power forecasts, and optionally, load forecasts, and use them determine the optimal amount of spinning reserve (additional capacity of base-load generation to cover possible unforeseen changes in load and intermittent generation) needed in an electrical grid or mini-grid.

Some techniques minimise the effect of sun-flare and make clouds near the sun more visible in an all-sky image by combining multiple images at different exposures from the same camera, or from multiple cameras with different exposures situated close to each other.

Some algorithms detect the formation and dissolution of clouds, specifically with an aim to detecting clouds forming from a clear sky near the sun which have a high probability of shading the sun in the near future.

Supervised learning techniques may use pixel data and cloud movement forecast information to predict solar irradiance and/or solar power production. These models are trained on historic sky-images and data from the same, or a different, location.

Potential uses of the technology include:
Remote Area Power System with photovoltaics (PV) and fossil fuel backup
Distributed PV—Residential/commercial rooftop PV
Large grid-connected PV—PV Solar farms
Large concentrating solar-thermal—heliostat field solar farms
Small solar-thermal—residential solar hot water, solar air conditioning
Energy markets—generator dispatch and maintenance planning
Commercial/Industrial building peak charge avoidance
Electrical network management and planning
Solar resource assessment and forecast validation—
Data sales to weather forecasting agencies
Home security FIG. 1a illustrates a solar system 100 comprising the sun 101 shining through clouds 102 onto a mirror 103. The mirror 103 reflects the sunlight onto solar tower 104, where the sunlight is converted to heat, which eventually generates electric power. Controller 105 moves mirror 103 to follow the sun 101 to maximise the amount of sunlight that reaches tower 104. When insufficient sunlight reaches the tower 104, controller 105 can start a diesel generator 106 or other alternative electrical generators to compensate for the reduction of power generated by tower 104 due to occlusion of the sun 101 by clouds 102. It is noted that in most practical applications there would be a large number of mirrors, such as 173,500 mirrors in the case of the Ivanpah Solar Electric Generating System. Each of these mirrors may be individually controlled by controller 105.

Controller 105 is faced with the difficulty that the system of mirror 103, tower 104 and diesel generator 106 presents a significant time lag between a control decision and the effect of the control. For example, once cloud 102 occludes the sun 101, the generated power drops faster than the start-up time of the generator 106. In another example, multiple mirrors are used and the aim is to maintain a constant power output, which means that at some times of high irradiation, some mirrors need to direct the sunlight elsewhere. Measuring the temperature in tower 104 may be too slow to perform an efficient control of the mirrors.

In order to address the time lag in the system, controller 105 predicts the solar irradiance. For example, controller 105 predicts the solar irradiance for the entire field of mirrors or for each mirror separately. Particularly for large arrays of mirrors, some mirrors may be shaded by cloud 102 while others are fully illuminated. By predicting the solar irradiance, controller 105 can determine more accurately, how to control the system including, when to start-up generator 106, whether to stop generator 106 or keep it running for the next occlusion or whether to adjust the orientation of mirror 103.

Three cameras 107, 108 and 109 support the prediction of solar irradiance by controller 105. In particular, the cameras 107, 108 and 109 capture sky images and present those image to a user. A user assists controller 105 by indicating on the sky images objects that may affect the solar irradiance, such as clouds 102, sun 101 or manmade objects including, planes, helicopters and blimps. This means the user identifies objects that would affect solar irradiance if they were at the right location, such as occluding the sun. However, in order to learn the appearance of those objects, the currently displayed objects may not actually occlude the sun but similar objects of the same type may occlude the sun at a later time. Based on these classification aids, controller 105 learns to classify further images and predicts the solar irradiation at any location within the area covered by cameras 107, 108 and 109.

Figure 1B:
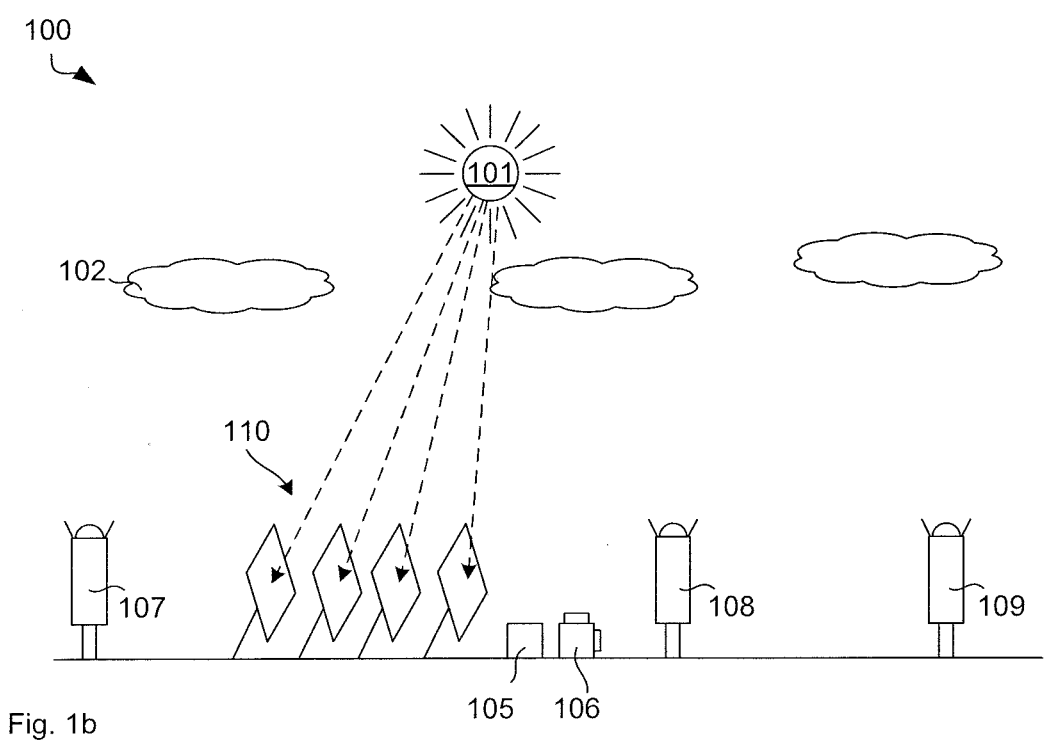
FIG. 1b illustrates a solar power system.

FIG. 1b illustrates a solar power system where the mirrors, such as mirror 103 in FIG. 1a, are replaced by an array of photovoltaic solar collectors 110 that generate electricity directly without first converting the irradiation to thermal energy. Similar to FIG. 1a, controller 105 controls the individual photovoltaic solar collectors 110 and generator 106 as described herein.

Figure 2:
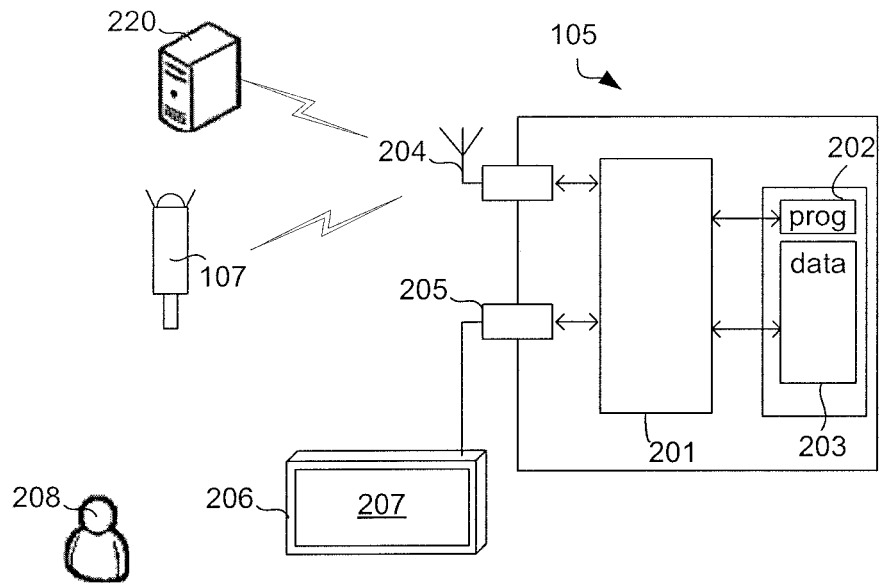
FIG. 2 illustrates the controller from FIGS. 1a and 2b in more detail.

FIG. 2 illustrates the controller 105 in more detail. The controller 105 is basically a computer system that comprises a processor 201 connected to a program memory 202, a data memory 203, a communication port 204 and a user port 204. The program memory 202 is a non-transitory computer readable medium, such as a hard drive, a solid state disk or CD-ROM. Software, that is, an executable program stored on program memory 202 causes the processor 201 to perform the method in FIG. 3, that is, processor 201 captures sky images by receiving image data from camera 107 through communication port 204. Processor 201 receives object location data being indicative of a location in the training sky images of an object that may affect the solar irradiance. This object location data may be generated by a computer vision algorithm that automatically detects the object in the image. Processor 201 may also generate on screen 106 a display 207 to receive user input indicative of objects that may affect solar irradiance from user 218. Processor 201 then determines a relationship between the location of the object and the solar irradiance and predicts the solar irradiance based on the relationship.

The processor 201 may then store the predicted solar irradiance value on data store 203, such as on RAM or a processor register. Processor 201 may also send the determined predicted solar irradiance value via communication port 204 to a server 220, such as a weather service provider.

The processor 201 may receive data, such as sky image data, from data memory 203 as well as from the communications port 204 and the user port 205, which is connected to a display 206 that shows a visual representation 207 of the test sky images as well as potentially the predicted solar irradiance to a user 116. In one example, the processor 201 receives the image data from cameral 107, 108 and 109 via communications port 204, such as by using a Wi-Fi network according to IEEE 802.11. The Wi-Fi network may be a decentralised ad-hoc network, such that no dedicated management infrastructure, such as a router, is required or a centralised network with a router or access point managing the network.

In one example, the processor 201 receives and processes the test sky images in real time. This means that the processor 201 determines the predicted solar irradiance value every time image data is received from one or more of the cameras 107, 108 and 109 and completes this calculation before the cameras 107, 108 and 109 send the next image data update.

Although communications port 204 and user port 205 are shown as distinct entities, it is to be understood that any kind of data port may be used to receive data, such as a network connection, a memory interface, a pin of the chip package of processor 201, or logical ports, such as IP sockets or parameters of functions stored on program memory 202 and executed by processor 201. These parameters may be stored on data memory 203 and may be handled by-value or by-reference, that is, as a pointer, in the source code.

The processor 201 may receive data through all these interfaces, which includes memory access of volatile memory, such as cache or RAM, or non-volatile memory, such as an optical disk drive, hard disk drive, storage server or cloud storage. The controller 105 may further be implemented within a cloud computing environment, such as a managed group of interconnected servers hosting a dynamic number of virtual machines.

It is to be understood that any receiving step may be preceded by the processor 201 determining or computing the data that is later received. For example, the processor 201 determines an image by pre-filtering or other image processing and stores the image in data memory 203, such as RAM or a processor register. The processor 201 then requests the data from the data memory 203, such as by providing a read signal together with a memory address. The data memory 203 provides the data as a voltage signal on a physical bit line and the processor 201 receives the image data via a memory interface.

It is to be understood that throughout this disclosure unless stated otherwise, nodes, edges, graphs, solutions, variables, values and the like refer to data structures, which are physically stored on data memory 203 or processed by processor 201. Further, for the sake of brevity when reference is made to particular variable names, such as "period of time" or "solar irradiance" this is to be understood to refer to values of variables stored as physical data in controller 105.

Figure 3:
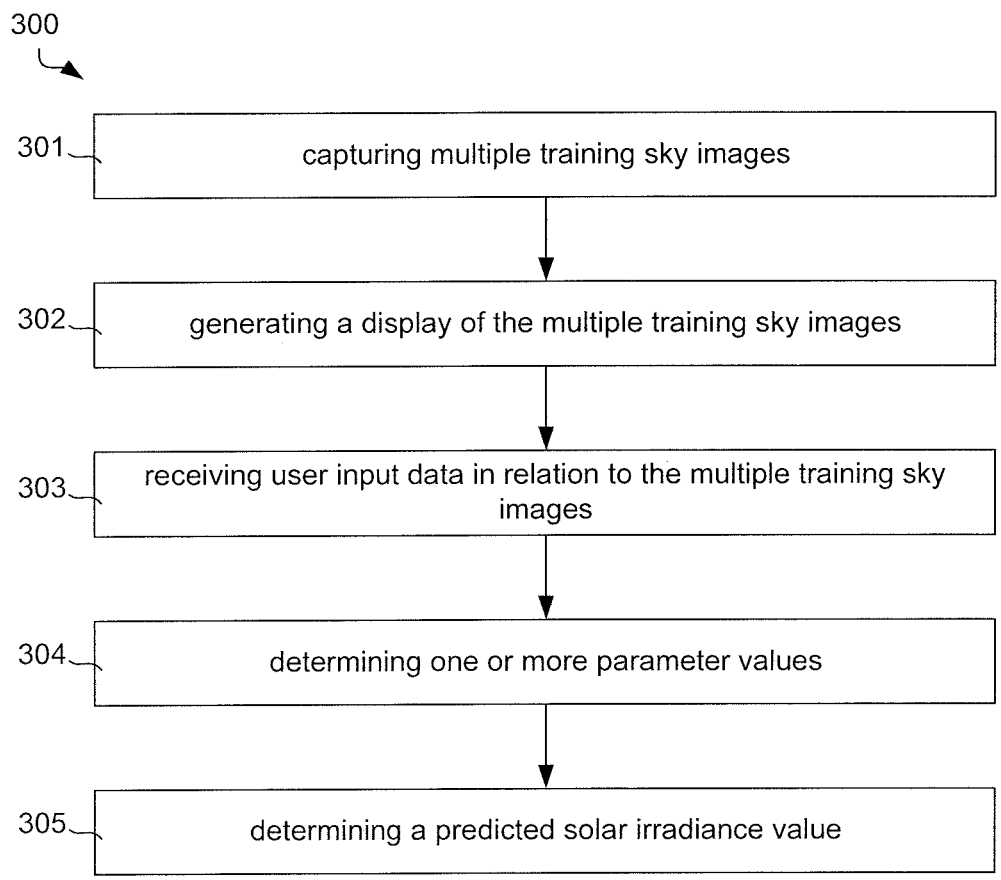
FIG. 3 illustrates a method for predicting solar irradiance.

FIG. 3 illustrates a method 300 as performed by processor 201 for predicting solar irradiance. FIG. 3 is to be understood as a blueprint for the software program and may be implemented step-by-step, such that each step in FIG. 3 is represented by a function in a programming language, such as C++ or Java. The resulting source code is then compiled and stored as computer executable instructions on program memory 202.

Method 300 commences by processor 201 capturing 301 multiple training sky images by an image sensor, such as by cameras 107, 108 and 109. Capturing images may comprise requesting (pull) image data from the cameras 107, 108 and 109 or receiving unrequested (push) image data. Capturing may also comprise the actual process performed by the semiconductor device while keeping an aperture open while light irradiates the semiconductor to cause electrons to move in a detectable way, including CMOS and CCD principles. During the capturing of the multiple training images, the image sensor may remain at a constant location, orientation and lens configuration. Location includes latitude, longitude, altitude or other coordinates, orientation includes angles that define the line of sight of the image sensor. Lens configuration includes focal length. Constant location, orientation and lens configuration means that these parameters do not change substantially between capturing the multiple training images. In other words, locations of objects that do not move appear at the same pixel location for all of the multiple training images. Consequentially, shutters and apertures are not part of the lens configuration and therefore, shutter speed and aperture size may vary between different training images to adapt to different lighting conditions without influencing the pixel location of objects in the images.

In other examples, the location, orientation and lens configuration is predetermined. For example, the orientation of the image sensor may change with the seasons according to the different azimuth of the sun. This change is predefined in the sense that the processor 201 can retrieve the current value from data memory to take the current value into account when determining the position of the sun and the clouds. In yet another example, the current position and orientation may be measured by sensors including inertial sensors in cases where the sensor platform is not stable, such as on vehicles, ships, drones, etc.

Figure 4:
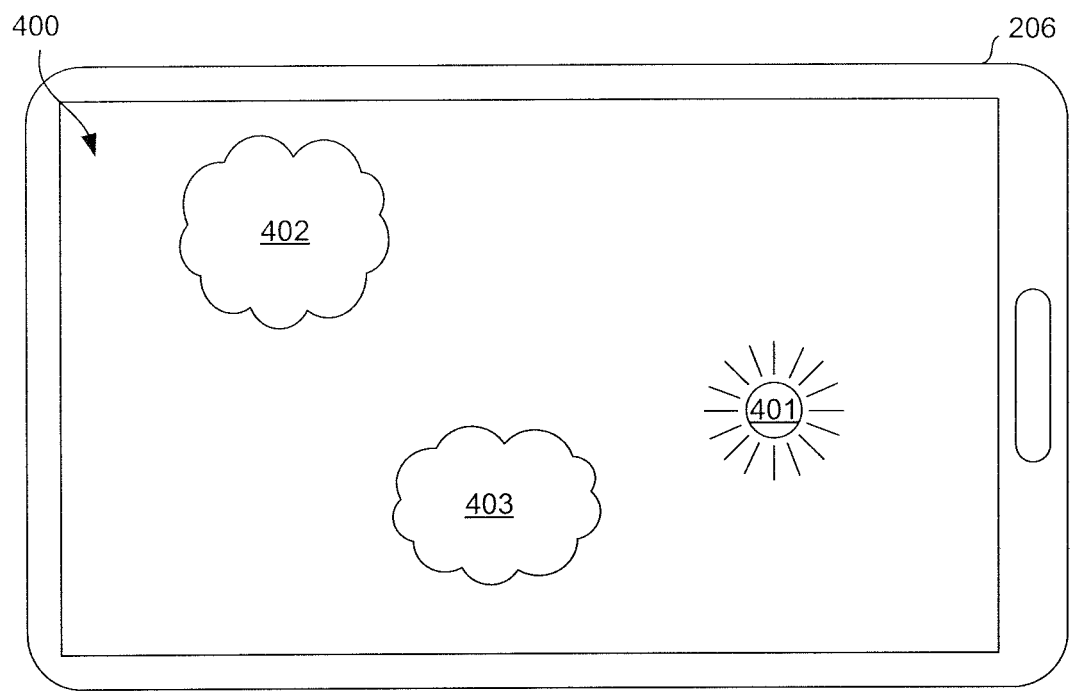
FIG. 4 illustrates an example display.

Next, processor 201 generates a display of the multiple training sky images. FIG. 4 illustrates an example display, where one of the multiple training sky images is displayed. The display shows the sun 401 and clouds 402 and 403. However, it is difficult to accurately detect the sun and the clouds automatically. Therefore, user 208 taps on the touch screen 206 to classify certain pixels as cloud, clear sky or sun.

Processor 201 receives this user input data in relation to the multiple training sky images. The user input data is object location data indicative of a location in the training sky images of an object that may affect the solar irradiance. Objects include clouds and the sun. For example, the user input data comprises a pair of values (150,100) that indicates that the user 208 has classified a pixel at column 150 and row 100 as cloud. In this example, processor 201 receives the data via the activation of an interrupt from the touch screen controller over a device bus. In other examples, device 206 is external to the controller 105 and processor 201 receives the user input data over the internet or other data connections including Wifi and Bluetooth.

Alternatively, or in addition to the above, processor 201 may receive the object location data by performing a computer vision algorithm to automatically detect the objects, storing the result on data memory 203 and receive the object location data from data memory 203. For example, processor 201 may automatically identify position of the sun in clear-sky conditions by searching for highly saturated pixels that form a roughly circular region in the image.

Based on the object location data, processor 201 determines one or more parameter values. The parameter values are indicative of a relationship between the location of the object and the solar irradiance.

In the case of the sun 401, processor 201 may calculate the orientation of the camera 107, for example, since the orientation is indicative of the relationship between the pixel location of the sun in the image and the solar irradiance. By using multiple training images and the time difference between those images were taken, processor 201 can determine the fisheye lens geometry, position and orientation of the image sensor. Since these parameters are indicative of the relationship between the location of the sun and the solar irradiance, with this information processor 201 can predict the movement of the sun across the image. In one example, processor 201 uses the Omnidirectional Camera Calibration Toolbox for Matlab (OCamLib) from the University of Zurich with multiple photos of a checkerboard pattern. After calculating this calibrated fisheye model, processor 201 may use a standard sun azimuth/zenith model, to calculate the sun's rough angle in the sky, and use the fisheye model to determine which fisheye-image pixel that corresponds to.

Unless the camera is perfectly flat and true-north facing, this location may be inaccurate, so processor 201 performs an optimisation to fit a model of the user-input true sun location to the calculated one, allowing rotational and translational errors. Once, 10-images, for example, have been processed like this, processor 201 may have calculated an accurate estimate of the pixel coordinate of the sun for any other timestamps, in images from this camera (assuming a fixed position and fixed lens configuration).

For example, using a sun location model that determines azimuth and zenith for a known latitude, longitude and time, processor 201 can calculate, for a given instant in time, an error between a) the sun's calculated azimuth and zenith angles and b) a user-input sun coordinate 401 in the image. Using a number of such calculations from images taken at different times on a clear-sky day, the standard sun location model can be corrected for the specific camera orientation, by fitting a model to the standard model which minimises the location errors. This corrected model allows the highly accurate prediction of sun location in a sky image from this camera for any time.

At one time instance $t_1$ processor 201 has one pair of sun locations in the two images, say $(v_1, v_1')$, and at another time instance $t_2$ processor 201 has another pair of sun locations in the two images, say $(v_2, v_2')$. Note that each of these vectors are in the 3D space. Processor 201 may calculate the following two steps closed-form solution to obtain the relative rotation information based on the two or more pairs of matched sun locations: firstly estimating the rotation axis and then estimating the rotation angle around this axis.

Rotation Axis

For the two vectors $(v_1, v_1')$, processor 201 finds a plane $\pi_1$ which is perpendicular to the plane formed by $v_1$ and $v_1'$, and bisects $v_1$ and $v_1'$. Similarly processor 201 finds a plane $\pi_2$ for $(v_2, v_2')$. Then, processor 201 finds the intersection line for plane $\pi_1$ and plane $\pi_2$. The direction of this intersection line is the rotation axis that processor 201 is to obtain and is denoted as $v_{axis}$.

Rotation Angle

Once the rotation axis is obtained, the rotation angle around this axis can be obtained. For a vector v, it can be decomposed into two components: one is parallel to $v_{axis}$ and the other is perpendicular or normal to $v_{axis}$. In this example, $v_n$ represents the normal component of v. Similarly, $v_n'$ represents the normal component of v'. The rotation angle θ is the angle between the two vectors $v_n$ and $v_n'$ which can be obtained by $$\theta = \cos^{-1} \frac{v \cdot v'}{PvPPv'P}.$$

The rotation matrix R can then be constructed based on the following formula using the rotation axis and rotation angle information:

$$R = I + (\sin \theta)H + (1 - \cos \theta)H^2$$

where I is the identity matrix and H is a skew-symmetric matrix composed of the elements of the rotation axis.

If multiple pairs or sets of distant object locations in the two or more images of a common area of sky can be obtained, then for each two pairs or sets of object location information, the rotation axis and rotation angle can be obtained. In one example, the distant objects considered in obtaining the rotation axis and rotation angle may comprise the sun, moon, bright stars or satellites. Multiple such measurements can be combined, either by simple averaging or through more involved robust estimation, to obtain more accurate and/or reliable rotation information.

Image Transformation

With the obtained rotation information for the two images from the cameras, one of the images can be rotated so that it is better aligned with the other image. This is a process to transform one of the original fisheye image to a transformed fisheye image which should have the same imaging angle with the other original image. Undistorted images can also be obtained if necessary using camera calibration parameters.

Camera Translation

Given the available camera rotation information, the translation between two cameras can also be obtained using image feature matching information. This feature matching information can be obtained by automated sparse feature matching or dense optical flow estimation process. Good feature matches can be selected from optical flow estimation results.

Cloud Height Calculation

With the obtained camera geometry information which includes the rotation and translation and image measurements, which can be obtained through feature matching, dense stereo matching, or optical flow estimation, cloud heights and other 3D information about objects in the sky can be obtained using stereographic techniques, i.e. by measuring the apparent relative translation (in pixels or sub-pixels) of visible clouds in two or more images with overlapping fields of view.

A network of cameras may be made of sets (pairs, triples, quads, etc.) of closely spaced (100 m-2 km) cameras. Each set may be spaced apart from other sets by 2-20 km. This allows accurate 3D cloud modelling using stereo within each closely-spaced set using stereography to produce accurate 3D point clouds or meshes of the objects, while also allowing wide coverage by using multiple sets with a small amount of overlap with other sets to provide maximum wide-area coverage using a small number of cameras.

In the case of the clouds 402 and 403, processor 201 retrieves the pixel colour and movement values and textural information from user-identified cloud and sky areas and trains a classifier. The classifier can then be applied to test images to determine the location of clouds in the test images. Over multiple test images, processor 201 can determine the movement of the clouds, such as speed, and predict when the clouds will occlude the sun at the predicted sun location. This way, processor 201 determines a predicted solar irradiance value based on the parameter values. In one example, the outcome is binary. That is, the result is either indicative of either; a level of shading; or of clear-sky irradiance. In another example, the result is a continuous irradiance value (e.g. from 0 to 1000 W/m2).

The user input data is indicative of a classification of pixels of the multiple training sky images, the classification being in relation to a cloud cover in the sky images. For example, the user interface 400 may comprise instructions to the user, such as "Please tap on clouds". Each time the user taps on a pixel of the image, processor 201 receives the RGB colour values of a group of pixels. Processor 201 uses this RGB colour value as a training sample that is classified positively as 'cloud' (TRUE). User interface 400 may change the displayed instructions to "Please tap on clear sky". Processor 201 may then use the received RGB values as training samples classified negatively, that is, blue sky (FALSE). In another example, the user may be asked to classify thin and thick clouds separately in a series of images.

Processor 201 repeats the steps of receiving the training samples until processor 201 learns a model that is sufficiently accurate. In other words, processor 201 calculates parameter values based on the user input data and these parameter values are parameter values of a cloud model and therefore, indicative of the relationship between the location of the cloud and the solar irradiance. While in some examples processor 201 calculates the current position of the clouds 402 and 403, repeating this calculation can lead to movement estimation and therefore, the position is indicative of a relationship between the location of the clouds 402 and 403 and the solar irradiance.

In one example, the one or more parameter values are parameter values of a supervised learning classifier based on the user input data. In that case, processor 201 can use a pixel of a later captured test sky images as an input to evaluate the classifier that outputs a classification as cloud or clear sky (or further classes as described herein). Processor 201 then determines the predicted solar irradiance value based on the classification and projected movement of all pixels, relative to the sun's location. In particular, processor 201 repeats the classification steps for subsequent test images to determine movement of the clouds and when the movement intersects with the movement of the sun.

In one example, the classifier is a supervised learning classifier and preferably, is an ensemble classifier comprising multiple-sub classifiers. Processor 201 determines the classification by applying the ensemble classifier to a pixel of the test sky image to calculate for each of the multiple sub-classifiers an output classification. Processor 201 then determines the classification for the pixel based on the output classification of each of the multiple sub-classifiers. For the example of a Bayes optimal classifier, processor calculates $$y = \text{argmax}_{c_j \in C} \sum_{h_i \in H} P(c_j | h_i) P(T | h_i) P(h_i)$$

where y is the predicted class, C is the set of all possible classes, such as "cloud" and "clearsky" or more classes in between. His the hypothesis space, P refers to a probability, and T is the training data, that is, the training pixel values labelled by the user from the training sky images.

In another example, the ensemble classifier is a random forest and the sub-classifiers are decision trees as described in Breiman, Leo (2001). "Random Forests". *Machine Learning* 45 (1): 5-32, which is included herein by reference. Processor 201 trains the random forest by using tree learners and applying bootstrap aggregating, or bagging, that is, processor 201 selects a random sample with replacement of the training pixel values. Processor 201 fits trees to these samples:

For b=1, . . . , B:
Sample, with replacement, n training examples from X, Y; call these $X_b$, $Y_b$.
Train a decision or regression tree $f_b$ on $X_b$, $Y_b$.

Processor 201 then applies the trained classifier to pixels of the test images and averages the predictions from all the individual regression trees on x' for each pixel:

$$\hat{f} = \frac{1}{B} \sum_{b=1}^{B} \hat{f}_b(x')$$

Processor 201 may further randomly select subset of features for each decision tree. The features considered in the decision tree may comprise a weighted sum of the change in these values from a number of previous images. In another example the features may comprise texture information from the surrounding pixels, Red, Green, Blue (RGB) channels. In another example the features may comprise the distance from the pixel to the sun's location in the image, Hue, Saturation, Brightness (HSV) channels, a weighted sum of the change in these values from a number of previous images, texture information from the surrounding pixels. In another example the features may comprise the distance from the pixel to the sun's location in the image, Hue, Saturation, Brightness (HSV) channels, a weighted sum of the change in these values from a number of previous images, texture information from the surrounding pixels, Red:Blue ratio (RBR), Red, Green, Blue (RGB) channels, Red-Blue difference (RBD), an estimated amount of movement from a number of previous images, or the sun's current azimuth and zenith angles. In another example the features may comprise texture information from the surrounding pixels, an estimated amount of movement from a number of previous images. In another example the features may comprise Red-Blue difference (RBD), Hue, Saturation, Brightness (HSV) channels, the sun's azimuth and zenith angles, texture information from the surrounding pixels, Red, Green, Blue (RGB) channels, a weighted sum of the change in these values from a number of previous images, keypoint location, Viola-Jones rectangular features. In another example the features may comprise the sun's azimuth and zenith angles, Viola-Jones rectangular features, Red, Green, Blue (RGB) channels. In another example the features may comprise the distance from the pixel to the sun's location in the image, Hue, Saturation, Brightness (HSV) channels, scale-invariant feature transform (SIFT) features. In another example the features may comprise the distance from the pixel to the sun's location in the image, Hue, Saturation, Brightness (HSV) channels, Red:Blue ratio (RBR), Viola-Jones rectangular features, Red, Green, Blue (RGB) channels, an estimated amount of movement from a number of previous images. In another example the features may comprise the distance from the pixel to the sun's location in the image, Viola-Jones rectangular features, Hue, Saturation, Brightness (HSV) channels, Red-Blue difference (RBD), keypoint location, Red:Blue ratio (RBR), the sun's azimuth and zenith angles, Red, Green, Blue (RGB) channels, scale-invariant feature transform (SIFT) features. In another example the features may comprise the distance from the pixel to the sun's location in the image, a weighted sum of the change in these values from a number of previous images, Red:Blue ratio (RBR), keypoint location, an estimated amount of movement from a number of previous images, texture information from the surrounding pixels, Red-Blue difference (RBD). In another example the features may comprise Red:Blue ratio (RBR), a weighted sum of the change in these values from a number of previous images, Red-Blue difference (RBD), texture information from the surrounding pixels, scale-invariant feature transform (SIFT) features, Hue, Saturation, Brightness (HSV) channels. In another example the features may comprise keypoint location, an estimated amount of movement from a number of previous images, Hue, Saturation, Brightness (HSV) channels, a weighted sum of the change in these values from a number of previous images, Red, Green, Blue (RGB) channels, Viola-Jones rectangular features, scale-invariant feature transform (SIFT) features.

In this sense, during training based on the training images, processor 201 determines the ensemble classifier by determining nodes and edges of the random forest. That is, processor 201 learns that certain features (nodes) are connected (edges) if these features are indicative of a classification (leafs/terminal nodes). In other words, a path from the top node to the classification output indicates which features contribute to that classification. For example, a high value in the brightness channel (V) of a pixel is likely to contribute to a 'cloud' classification because clouds are generally brighter (white) pixels.

In one example, processor 201 also classifies each image pixel using a Red-Blue Ratio. That is, if the Red-Blue Ratio is above a predetermined threshold, processor 201 classifies that pixel as cloud. In one example, processor 201 classifies as a cloud if RBR>0.95. In other examples, the threshold test is RBR>1.0, which is particularly useful if the sensor or JPEG compression produce a lot of image noise. If the Red-Blue Ratio is below the threshold, processor 201 evaluates the ensemble classifier and classifies the pixel as cloud if the ensemble classifier outputs a cloud classification. In other words, the final cloud pixels are a union set of the cloud pixels from the Red-Blue Ratio threshold and the cloud pixels from the ensemble classifier.

As mentioned above, processor 201 may capture multiple test sky images and apply the supervised learning classifier to pixels of the multiple test sky images. Processor 201 then determines a classification in relation to a cloud cover for each of the multiple test sky images. Processor 201 can then determine the predicted solar irradiance value by determining a movement of cloud pixels and determining the predicted solar irradiance value based on the movement of the cloud pixels. For example, processor 201 may determine a motion vector of pixels classified as having a cloud cover that is above a predetermined threshold, such as by following the H.264/MPEG-4 AVC standard. In another example, processor 201 uses the Farneback algorithm. In this sense, processor 201 calculates the difference of the location of cloud pixels between subsequent images and uses this difference to determine for each cloud pixel a movement direction and speed.

In one example, processor 201 divides the test sky image into blocks and minimises an error of block-matching between subsequent images. In another example, processor 201 uses a continuous area of cloud pixels as one object and displaces that cloud object in an earlier frame until the displaced object minimises a difference to a later frame. The amount of direction of the displacement is then identical to the movement of the cloud between the two images.

Similarly, processor 201 may apply transformation other than displacements to the cloud object. For example, processor 201 increases the size of the cloud object until a difference to a later image is minimised. This allows the processor 201 to consider cloud formation, that is, the generation of new clouds or growing clouds. In this sense, processor 201 determines the predicted solar irradiance value by determining cloud formation based on the classification and determining the predicted solar irradiance value based on the cloud formation.

Processor 201 can then use the motion vector to calculate a predicted time value or a predicted magnitude value or both for the predicted sun occlusion event. That is, processor 201 calculates how long it will take the cloud to reach the sun based on the current speed and direction of the cloud and the distance to the sun.

In another example, processor 201 determines a cloud altitude, such as by further sensors including laser, radar, satellite or stereovision from two or more separate cameras. Based on the altitude, processor 201 can then calculate how the clouds will cast a shadow on the earth by applying raytracing or other shadow construction techniques, or using geometric transforms of the classified cloud image from a camera with known lens geometry. Processor 201 may also take topographical data into account when determining shadow locations. A characteristic value of the shadow may be an outline of the shadow or a location of the shadow. Processor 201 may have stored a map or other representation of the forecast area, such as a grid of points on the earth's surface. Processor 201 may determine a degree of shadowing for each point of the grid which represents the predicted irradiance value at that point of the grid. Processor 201 may use predictive features and cloud-type classifications extracted from one or more concurrent cloud images and corresponding past irradiance or power measurements from several locations to model and predict the degree of shadowing at each grid point. Once a 3-dimensional model of the cloud layers is constructed, processor 201 can determine the timing of the shadowing by examining clouds predicted to intersect a line between the sun and the ground locations of interest. For example, a thin cloud, such as a alto-cirrus cloud, may only cast a weak shadow, which reduces the irradiation to 90% of the clear-sky value. In contrast, a thick, dark grey cumulus cloud may cast a strong shadow that reduces irradiation to 10% of the clear sky value.

The points of the grid may also be non-regular but instead, the locations of individual collectors, such as heliostats, linear Fresnel, parabolic trough, or dish collectors in a solar thermal facility method. As a result, processor 201 determines a solar irradiance value, such as a direct normal irradiance for each collector. This allows per collector selection and targeting control to optimise irradiance control and irradiance slew rate over a receiver surface, such as tower 104. For example, processor 201 maintains a list of collectors that is sorted in descending order by irradiation and selects collectors from the top of the list until a required amount of total solar irradiation at the collector is reached. In this sense, processor 201 performs automated control to optimise plant output. Since the receiver surface is utilised more efficiently, the proposed controls also optimise short term operability and/or long term operability.

With the above data, processor 201 may determine one or more of:

presence of clouds within a predetermined viewing angle of sun;

shading-time predictions; and solar power generation.

As shown in FIGS. 1*a* and 1*b*, multiple cameras 107, 108 and 109 may form a camera network. The processor 201 may receive captured test sky images from the multiple cameras in the camera network. The camera network may comprise more than 5 cameras, more than 10 camera, or between 10 and 20 cameras. In other examples, the camera network comprises over 100 cameras or even thousands of cameras, which is financially possible since the disclosed methods allow the use of low-cost cameras and low quality lossily compressed images which cost less to transfer and store.

Processor 201 can therefore combine the classifications of the individual camera pixels to generate location data indicative of a cloud cover and cloud characteristics for the area covered by the multiple cameras. For example, processor 201 may have stored information on an overlap of images from adjacent cameras and can therefore determine which clouds are seen by more than one camera. Processor 201 may also transform the fisheye images to linear images, that is, perform a correction of lens distortion and then stitch the images together to obtain one single image for the entire area covered by the camera network. Processor 201 can then apply the above methods on the single image to predict the solar irradiation and may predict photovoltaic performance, such as electrical energy generation in kW/h.

Over time, processor 201 may collect measurement data of actually produced energy and compare the measurement data to the predicted data. Processor 201 may then perform an optimisation method to adjust the configuration parameters of the image sensors. For example, processor 201 may calculate an optimised location of the image sensors, such that the difference between the prediction and the measurement is minimised.

Below is a description of the multi-camera orientation algorithm. The alignment (tilt and orientation) between all the cameras in a camera network, so that their respective images can be aligned accurately, which is important for estimating cloud height via triangulation, sun tracking, 3D cloud modelling and ground-shadow projection:

Multi-Camera Auto-Orientation Calibration

A closed-form solution for estimating the relative rotation parameters for any two cameras is disclosed. The algorithm only uses two or more pairs of sun location information from simultaneous images taken by two or more cameras at multiple time instances. It does not need to use the absolute sun location information which can be obtained by using the time and locations of the cameras. However, if the absolute sun location information is available, it can also be used. The algorithm is simple, direct, and non-iterative. This obtained rotation parameters can be used to generate undistorted images or to generate virtual fisheye images at a different viewing angle.

Once the rotation parameters are obtained, the translation parameters between the two cameras can also be obtained using linear algorithms from matched image feature points. The separation of the estimation for the rotation and translation parameters is helpful in achieving better parameter estimates. After the rotation and translation parameters are obtained, cloud heights can be measured using stereographic image feature matches from the two or more cameras.

The algorithm can be applied to multiple cameras which are installed in a city for obtaining all the orientation parameters for these cameras. An optional master camera can be selected as the reference point. Further processing in robust estimation of the parameters can also be carried out to remove bad image matches. Nonlinear parameter optimisation can also be used for parameter refinements.

The same algorithm can also be used to estimate the relative orientation between the fisheye camera and the absolute positioning of the Earth or the sun using the sun orientation relative to the earth and the pixel location of the sun in the image. A minimal of two pairs of such measurements are needed. Once this relative orientation between the camera and the Earth/sun is obtained, a correction on the image, or an artificial/synthetic fisheye image, can be made. Sometimes gross errors and mismatches can occur in the feature matching or sun location estimation process. In order to improve the parameter estimation process, robust estimation approaches, such as random sample consensus (RANSAC), least median squares, or other methods, can be used to remove the gross errors or bad matches. Only the good data are to be used for parameter estimations. The parameters obtained from the closed-form solution, either using or not using the robust estimation step, can be further improved using a nonlinear optimisation process based on the initial parameters obtained from the closed-form solution. This optimisation process may include all the good data points (after the robust estimation process if this process is included).

In one example, the image sensors apply exposure bracketing to provide multiple sky images for different exposures, such as five images over a range from +3 to −3 f-stops. This allows processor 201 to combine these images into a single HDR image, which addresses the problem of limited dynamic range from which low-cost image sensors typically suffer.

Cameras used in this disclosure may be configured to generate images with a digital resolution of 8 bit or less. Digital resolution may refer to the actual number of output bits of the A/D converters in the chip or the number of bits in the output file written on the camera's memory. This means the camera may employ a higher internal resolution or dynamic range and reduces the resolution or dynamic range of the data when it is written on memory, which is also referred to as downsampling. The use of 8 bit allows the use of inexpensive cameras while the above classification methods provide an accurate prediction even based on inferior image data. Some low cost cameras are further configured to generate image data with a pixel resolution of 1024×768 pixels or less and again, the above methods achieve good accuracy despite this low amount of image information. For example, the camera may comprise an image processor that receives the raw sensor data from a 7 megapixel CCD or CMOS sensor with 12 bit dynamic range, performs image processing, such as de-bayering, de-noising, colour balancing, and optionally downsamples the pixel resolution to 1024×768 and the dynamic range to 8 bit. The image processor then stores the resulting image as a file on memory, such as a JPEG image file, or sends the file to the controller 105.

The number of captured training sky images is such that the accuracy of the predicted performance is sufficient for generating a control signal that compensates for a difference between a power demand and the predicted photovoltaic performance. In one example, two sequential images may be sufficient at a minimum to give a forecast of irradiance or shading. Four or five images (at 10 second intervals) may give better performance as the noise in the motion vectors can be smoothed or filtered out.

The camera network is useful because it extends the single-camera forecast horizon of about 30 minutes, to several hours, and expands the area covered from about a 10 km radius to hundreds of square kilometres using multiple cameras, allowing the network to out-compete longer-term approaches such as satellite cloud prediction, for a fraction of the capital cost, but with much higher spatial resolution and temporal frequency. For example, a camera network could collect imagery every 1 second, at a 10 m grid resolution, whereas satellites will typically provide images every 15 minutes at around a 10 km grid.

The high spatial and temporal resolution forecast data this network provides has numerous applications in the fields of weather and power forecasting, energy network optimisation and control, electrical demand management, electrical storage management. Secondarily, the imagery collected may also be used for other applications like bushfire detection and location, home/business security, storm and lightning tracking & insurance, plane tracking and so on.

Figure 5A:
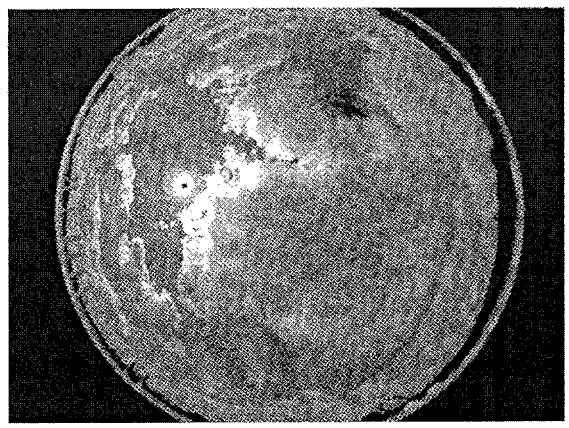
FIG. 5a illustrates an unprocessed sky test image.

FIG. 5a illustrates an unprocessed sky test image.

Figure 5B:
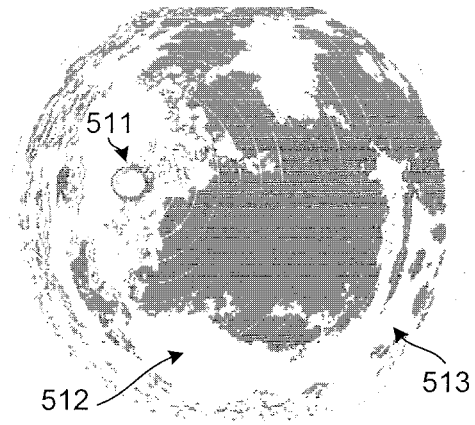
FIG. 5b illustrates an overlay over the sky test image in FIG. 5a where areas that are classified as cloud by a Red-Blue Ratio (RBR) classifier are shaded.

FIG. 5b illustrates an overlay over the sky test image in FIG. 5a where areas that are classified as cloud by a Red-Blue Ratio (RBR) classifier are shaded. This shows good performance for overcast sky and dark clouds. However, the RBR classifier misclassifies near the sun as indicated at 511 and misses thin and near-horizon clouds as indicated at 512 and 513.

Figure 5C:
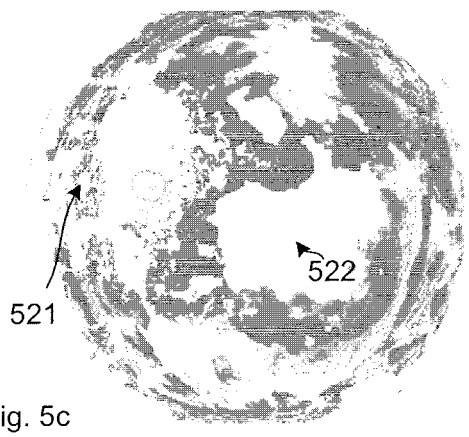
FIG. 5c illustrates an overlay over the sky test image in FIG. 5a where areas that are classified as cloud by a Random Forest (RF) classifier are shaded.

FIG. 5c illustrates an overlay over the sky test image in FIG. 5a where areas that are classified as cloud by a Random Forest (RF) classifier are shaded. This shows sensitivity to cloud edges and to thin and distant clouds. FIG. 3c also shows good near-sun performance. However, the RF classifier misses dark and non-textured cloud areas as indicated at 521 and 522.

Figure 5D:
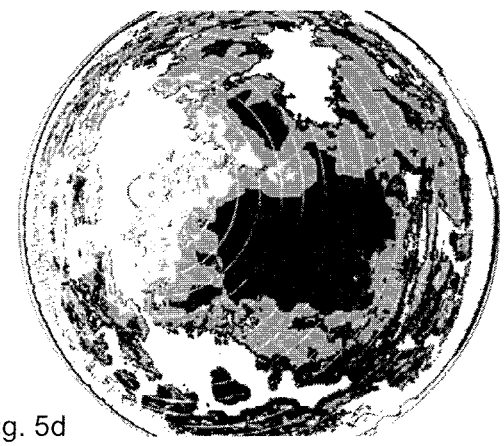
FIG. 5d illustrates a combined RBR and RF classifier where shading indicates area where both models agree while black indicates areas where only one model detects clouds.

FIG. 5d illustrates a combined RBR and RF classifier where shading indicates area where both models agree while black indicates areas where only one model detects clouds. This shows how the two model are complementary.

Figure 6:
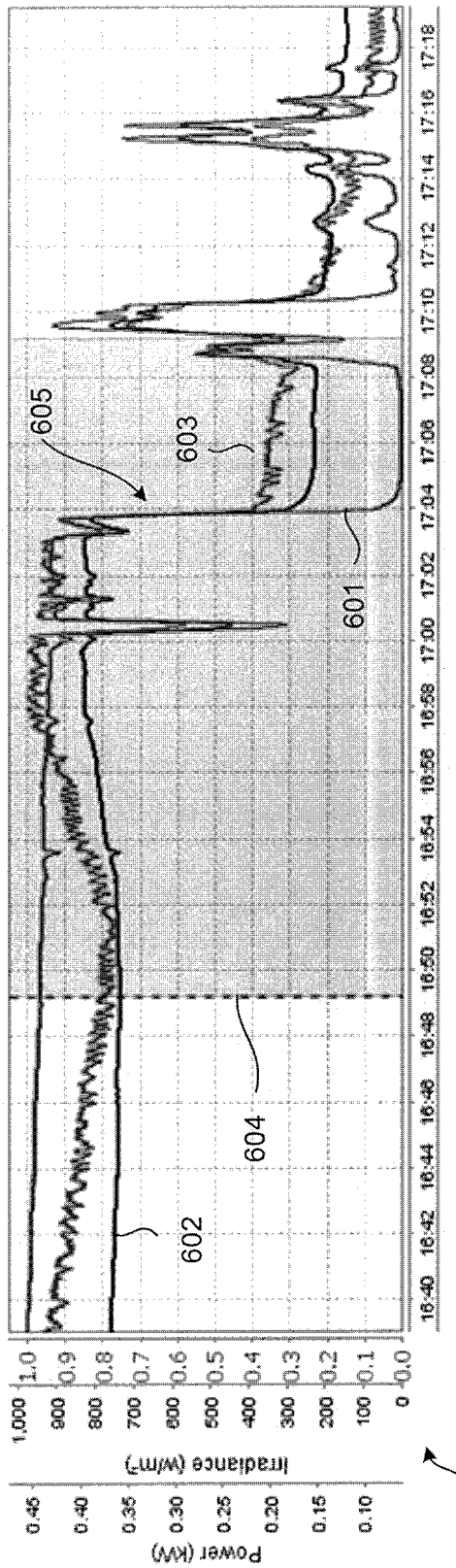
FIG. 6 illustrates an output chart.

FIG. 6 illustrates a chart 600 that may be outputted by the proposed systems and methods. The chart comprises Direct Normal Irradiance (DNI) 601, Global Horizontal Irradiance (GHI) 602 and Photovoltaic (PV) Power 603. The current time is indicated at 604 and the values to the right hand side of the current time 604 are predicted values. This shows that the sharp increase of cloud cover leads to a sharp decrease of predicted irradiance indicated at 605. There are about 7 minutes warning time, which is sufficient to prepare the system.

Figure 7:
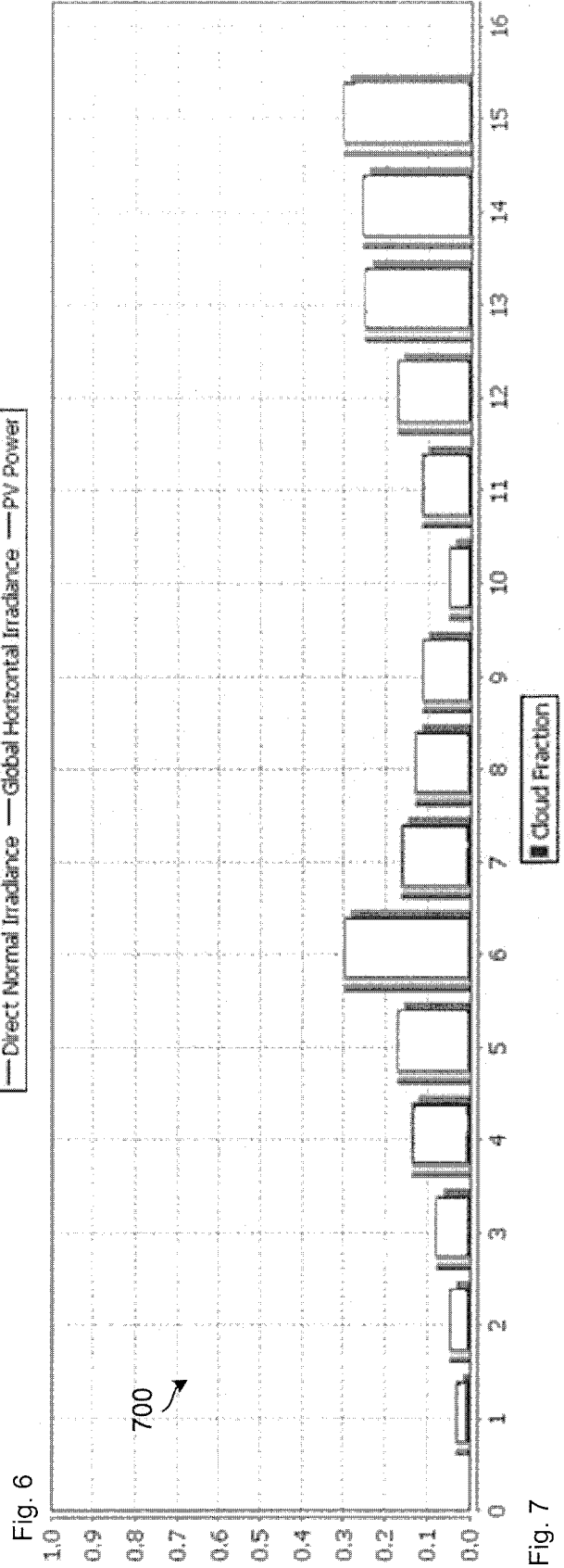
FIG. 7 illustrates an output histogram chart.

FIG. 7 illustrates a histogram chart 700 that may be outputted by the proposed systems and methods. The histogram chart comprises bars that show cloud percentage in concentric rings around the sun. That is, the x-axis denotes the increasing distance from the sun. In one example, this cloud presence data may be used by a control system for starting a generator to compensate for the probably upcoming shading of a photovoltaic array.

Figure 8A:
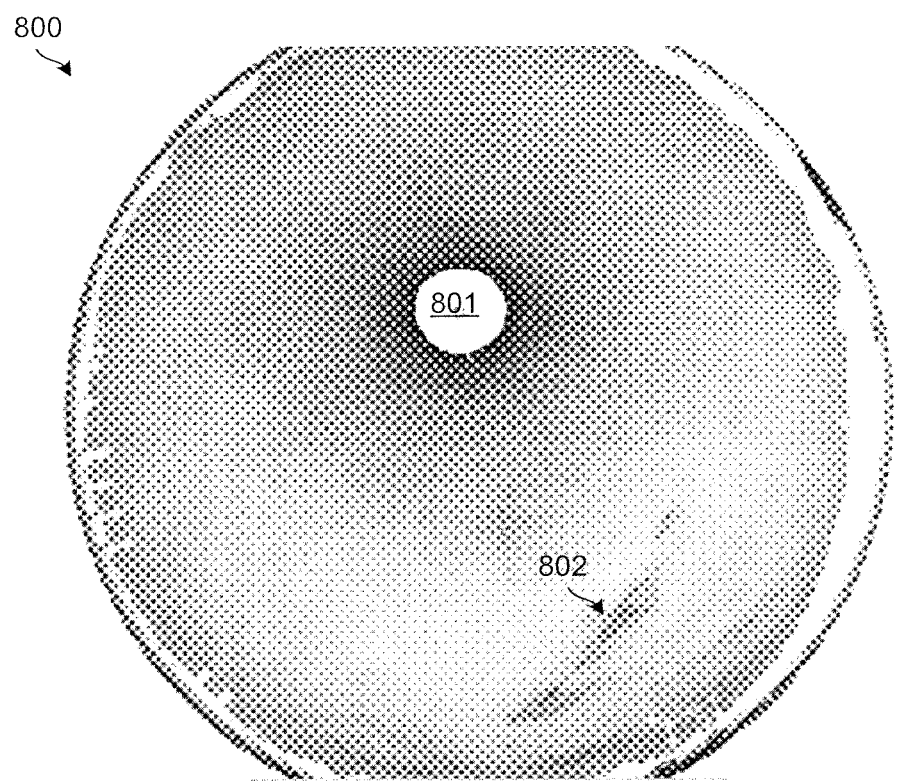
FIG. 8a illustrates a test sky image for motion vector estimation.
Figure 8B:
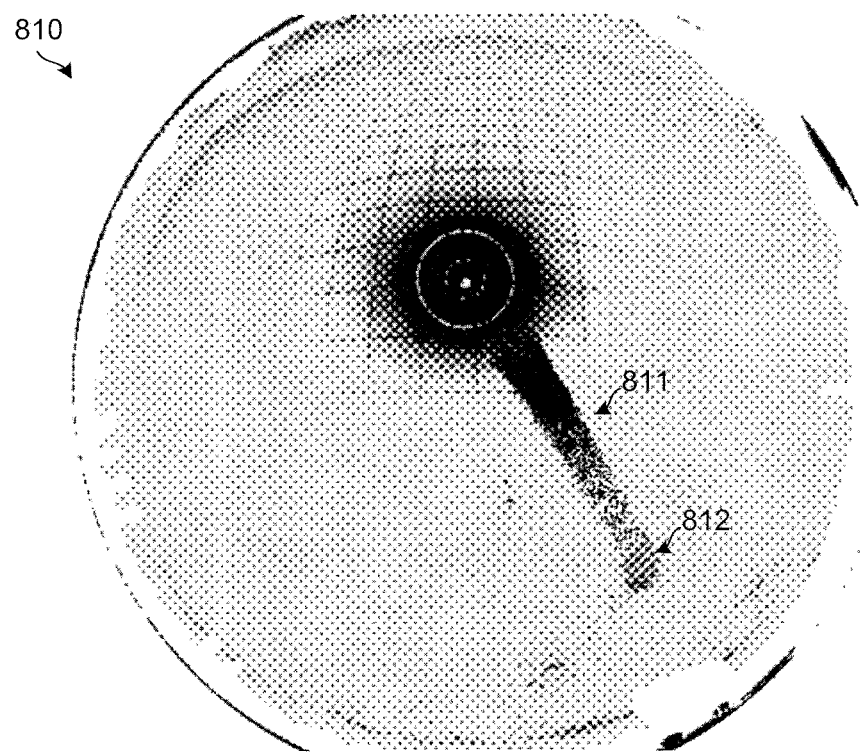
FIG. 8b illustrates an overlay over the test sky image to show the cloud's projected future path.

FIG. 8a illustrates a test sky image 800 for motion vector estimation. Test sky image 800 comprises sun 801 and distant cloud 802. Cloud 802 moves towards sun 801 and the aim is to predict when cloud 802 will reduce the solar irradiation. FIG. 8b illustrates an overlay 810 over test sky image 800 to show the cloud's projected future path 811 where black areas indicate the likely path of the cloud 802 in the future based on predicted positions of the sun and the projection of the cloud pixels' current motion vectors. In this example, a simulation over the following half hour is run at 10-second time-steps, taking all the motion vectors extracted from all the current image's pixels, and extrapolating them across the fisheye image, to calculate probable paths 811 the cloudy pixels will take in future. If any of these paths cross into the region around the sun 801 during this simulation, the paths, and their originating cloud pixels 812, are marked for further analysis. This simulation results in estimates of the time until each of these cloudy pixels are likely to shade the sun, and features extracted from the originating cloud pixels 812 are used to estimate the amount of shading they are likely to cause. Because this approach operates on a per-pixel level, it can take into account an arbitrary number of cloud pixels, clouds and cloud layers moving with an arbitrary number of different velocities. Because the simulation is performed entirely in fisheye space, it is computationally efficient, and can consider every pixel individually.

Figure 8C:
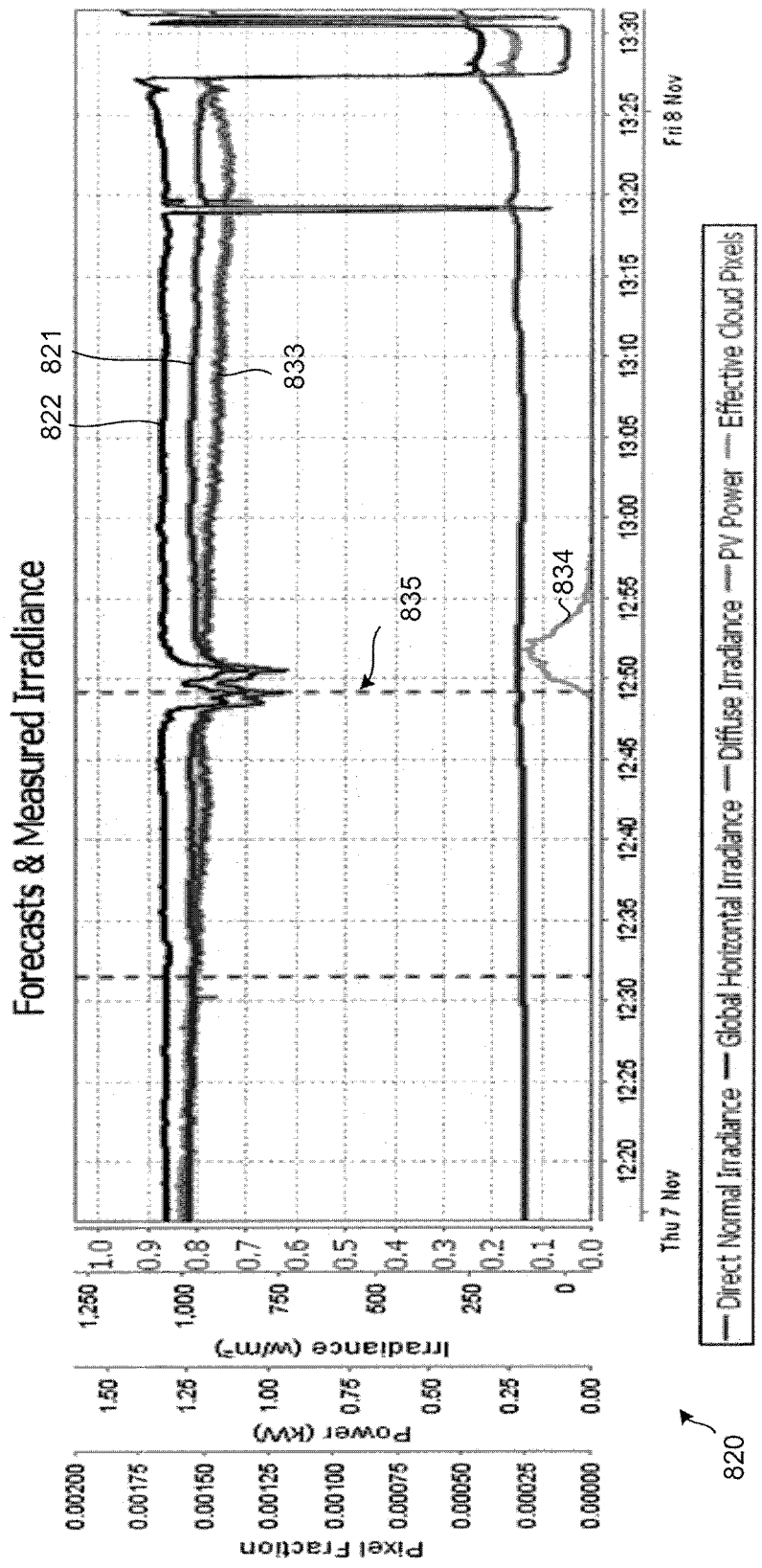
FIG. 8c illustrates output charts.

FIG. 8c illustrates charts 800 including DNI 801, GHI 822, PV power 833, effective cloud pixels 834, which is the number of pixels in shaded area 812 in FIG. 8b. FIG. 8c further shows the occlusion event at 835 caused by cloud 802 in FIG. 8a.

Figure 9:
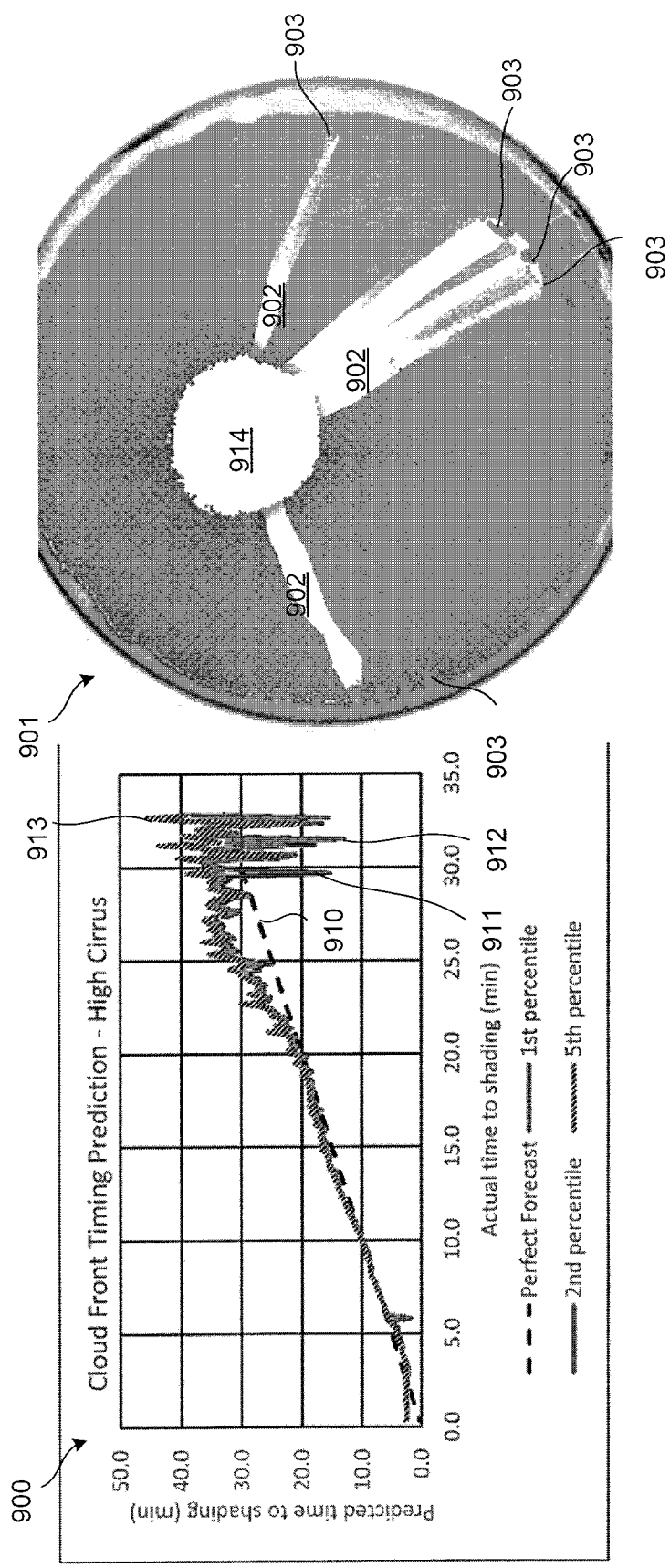
FIG. 9 illustrates a chart and sky image of a cloud front timing prediction for high cirrus type clouds.

FIG. 9 illustrates a chart 900 and sky image 901 of a cloud front timing prediction for high cirrus type clouds. This example illustrates the accuracy of the predicted time to a shade event, based on the extrapolated movement vectors 902 of pixels 903 of an approaching cloud from near the horizon. The chart 900 shows the predicted time-to-shading (vertical axis) versus the actual measured time to shading (horizontal axis). The dotted line 910 represents a perfect forecast. The further lines 911, 912 and 913 show the $1^{st}$, $2^{nd}$ and $5^{th}$ percentiles of the start of the cloud pixel histogram, respectively. These represent an estimated time until the front edge of the cloud enters the sun area 914. These estimates are calculated every 10 seconds from the time of the image shown, until the time of the beginning of the shade event. The chart 900 illustrates that the clouds were first detected about 33 minutes before the event, and that the forecast time-to-shading was very accurate (other curves are close to blue dotted line) from about 22 minutes, down to about 3 minutes before the event.

Figure 10A:
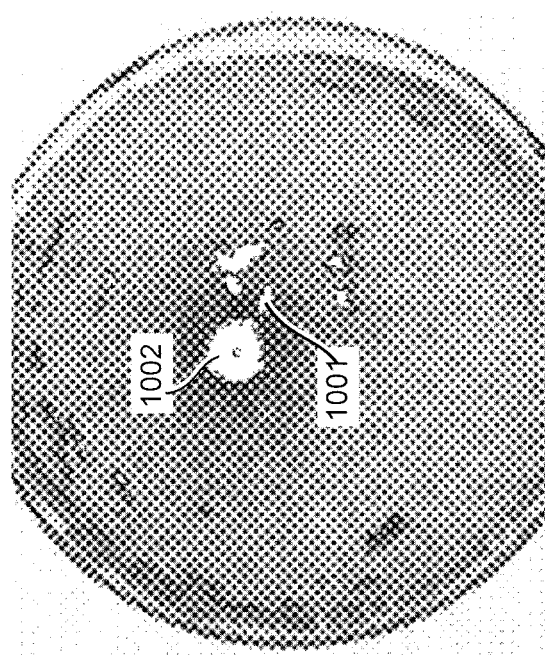
FIGS. 10a, 10b, 10c and 10d illustrate a sequence of test sky images.
Figure 10B:
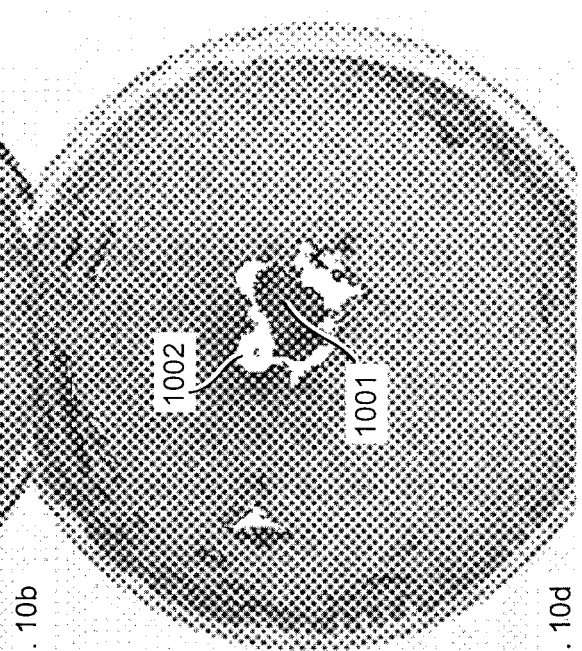
Figure 10C:
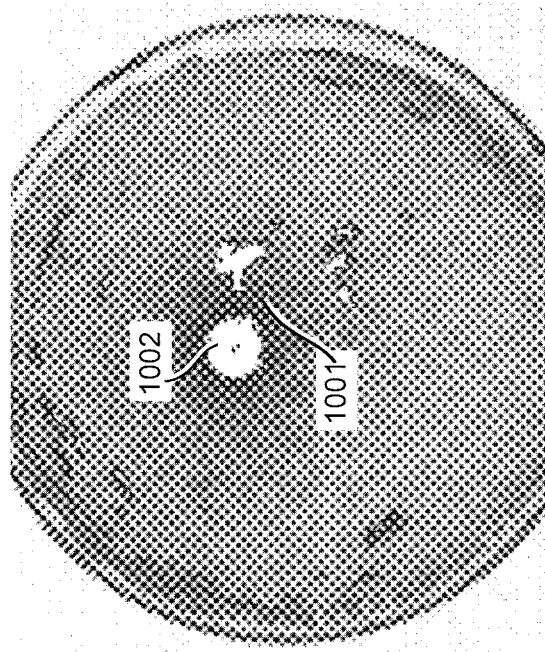
Figure 10D:
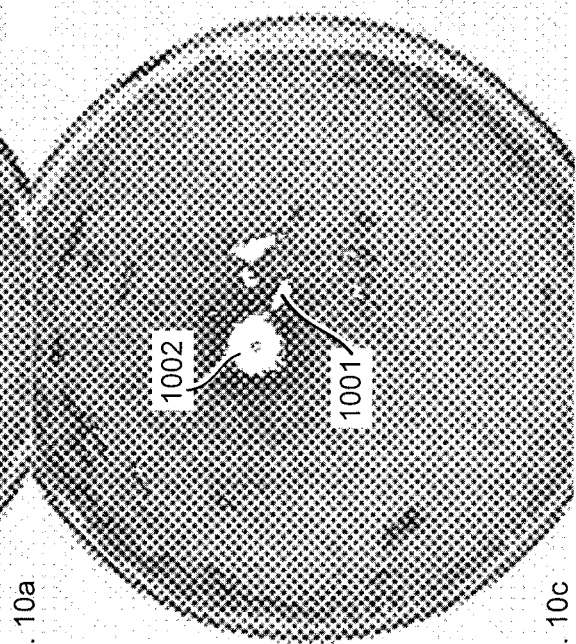

FIGS. 10a, 10b, 10c and 10d illustrate a sequence of test sky images. This sequence shows a cloud 1001, forming near the sun 1002 over 3 sequential frames (FIGS. 10a, 10b and 10c), and then jumps 4 minutes to show the formed cloud 1001 shading the sun 1002 (FIG. 10d). This particular cloud 1001 appears to be moving away from the sun 1002 as it forms, so may not be detected by the motion vector-based detection methods. Its rate of formation toward the sun 1002, however, is faster than its movement away, so it actually causes a shading event. Warnings generated from this formation detection algorithm provide sufficient time to take action before the event, which may not be possible using just the motion vector-based approach.

Figure 11A:
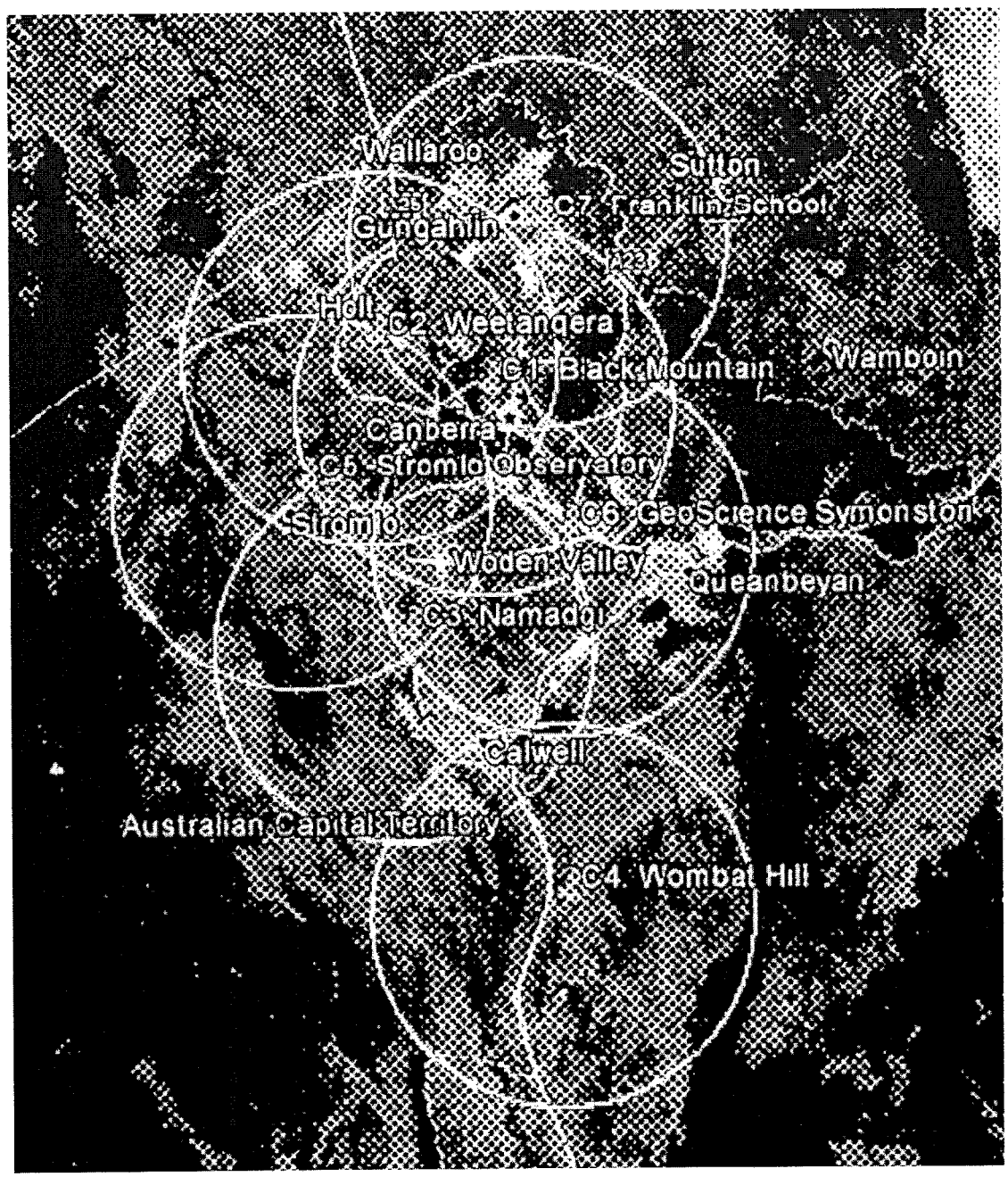
FIGS. 11a and 11b illustrate camera networks covering Canberra and Newcastle (Australia), respectively.
Figure 11B:
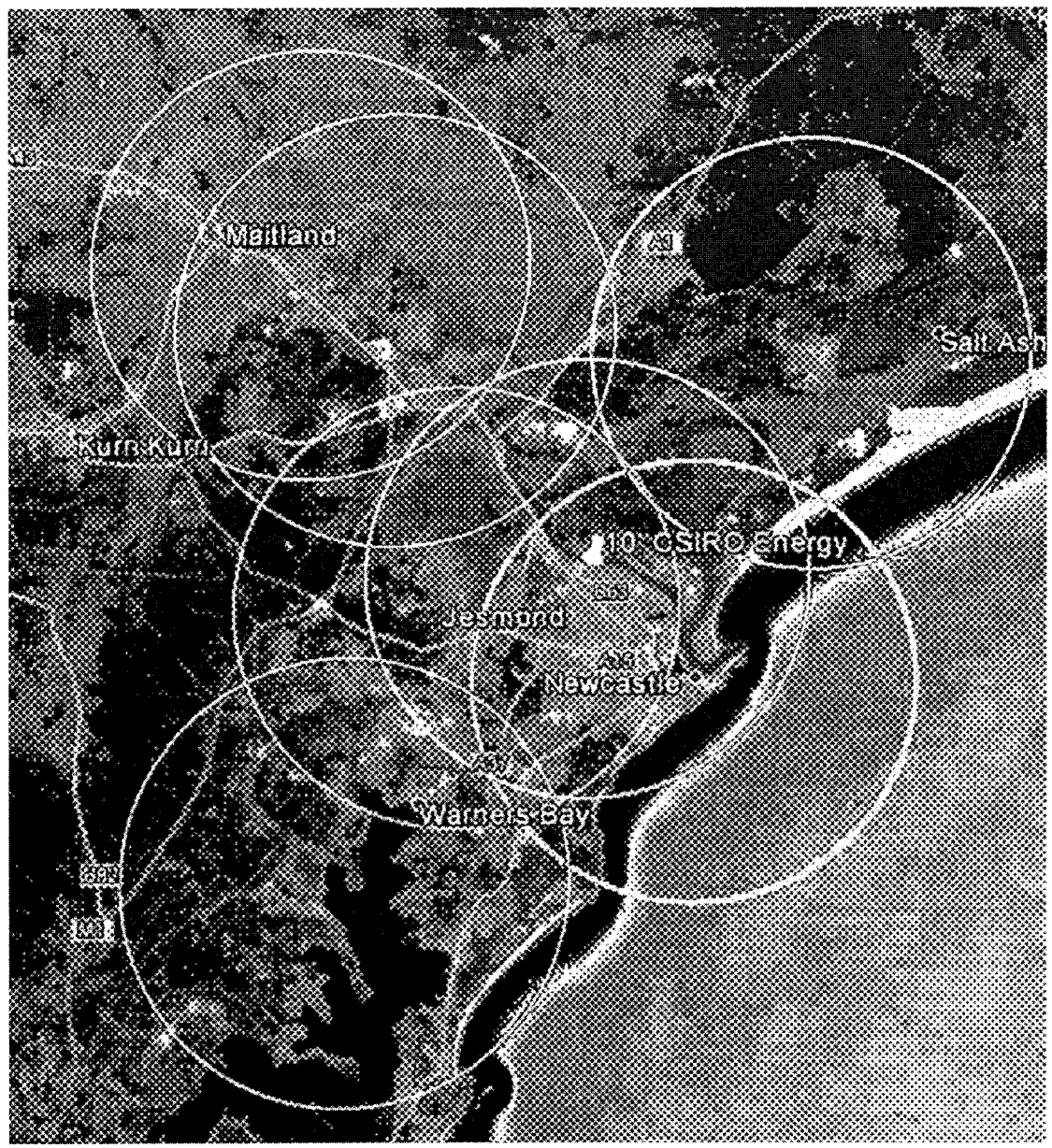

FIGS. 11a and 11b illustrate camera networks covering Canberra and Newcastle (Australia), respectively. The circles indicate a lower value of the field of view (with low cloud layers) of each camera in the network, positioned to provide overlapping coverage of the cities. The figures show that a small number of cameras can provide visual coverage of the entire city. In particular, 15 sites around Canberra and Newcastle are used for wide-area shading and irradiance forecasting.

There is provided a method for planning locations for network of cameras, taking into account:
  the cameras' spatial range,
  calculations of the spatial error functions of each camera,
  the ability to identify common cloud features for various cloud heights,
  the effect of topographical features on forecast accuracy and visible range,
  available physical locations for camera sites, and
  distribution of desired forecast locations.

A person trains the cloud classification model by using a tool developed to manually identify clouds and sky in a small number of images (by colouring them in). They can also identify cloud types (on a number of levels from thin to thick).

The advantages of the disclosed methods are:
  1. Using an RBR model alone for accurate cloud classification may involve a clear-sky library (which estimates the sky colour without clouds or aerosols) which can be time-consuming to build (it needs a large number of clear-sky images in a variety of conditions, over a long period of time). Training the RF model only requires about 10 images to be manually classified for the trained model to automatically classify all clouds accurately.
  2. It performs much better than traditional approaches with low-quality images from the inexpensive hardware we're using. These images may be lossily-compressed, visually noisy, have low dynamic (brightness) range, have more lens and sun-flare artefacts, and are lower resolution than hardware that is typically used.

In one example, processor 201 generates a control signal to control an inverter output to adjust ramp-rates in an electrical grid. Standard PV plants without storage or backup generators may exhibit power variations of up to 90% per minute, which is more than the typical compliance limit of 10%, for example. Ramp rate is essentially the speed at which a generator can increase (ramp up) or decrease (ramp down) generation. Generators have different characteristics, making some more suited to supplying certain needed functions. Since processor 201 predicts the solar irradiance, the ramp-up of the generator can be initiated earlier, which means more economical generators with lower ramp rates can be used. Processor 201 may also gradually reduce the output of solar power before a shading event to match the ramp-up of the generator. This can be achieved by processor 201 controlling an inverter that converts DC power from a solar panel to AC power for the grid.

Processor 201 may also generate the control signal to control energy storage charge and discharge rates and timing. For example, when processor 201 predicts high solar irradiation for the future, the energy storage (such as batteries) can be discharged more deeply beforehand. Conversely, if a longer period of low solar irradiation is predicted, processor 201 controls the system to maintain sufficient charge in energy storage.

Processor 201 may generate the control signal to control the rate and timing of energy consumption of electrical devices. For example, processor 201 may send control signals over the internet to electrical devices that may be not time critical, such as washing machines, central water heaters, pool pumps, electric car chargers and the like. This controls energy consumption of these devices such that energy consumption increases for times of predicted high solar irradiation and reduces energy consumption for times of predicted low solar irradiation.

Processor 201 may further control electrical devices to provide voltage, frequency and network services to the electrical grid, such as reactive power compensation. Finally, as mentioned above, processor 201 may control a generator to compensate for a reduction of performance caused by a cloud cover reducing irradiance of the photovoltaic system (ramp-up).

Figure 12:
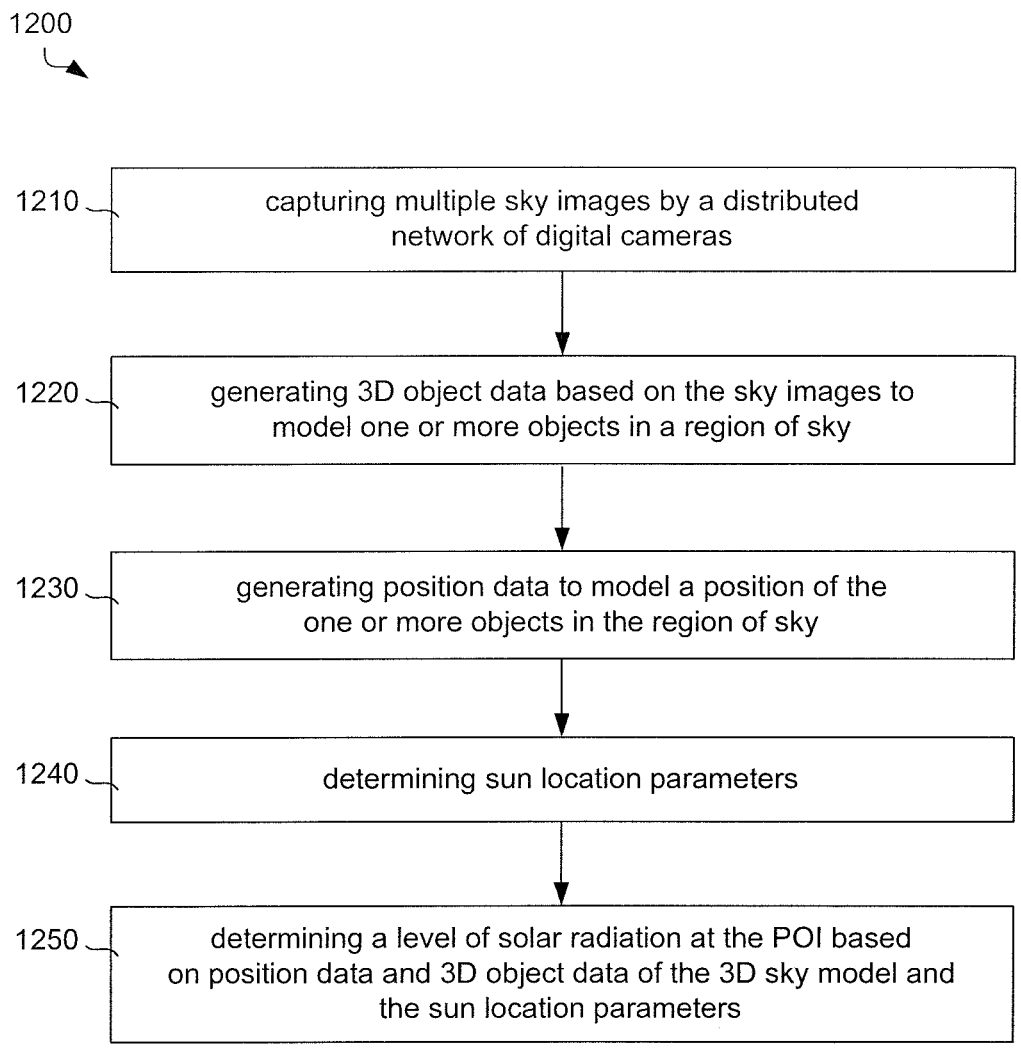
FIG. 12 illustrates a method for determining a level of solar radiation at one or more points of interest (POIs).

FIG. 12 illustrates a method 1200 for determining a level of solar radiation at one or more points of interest (POIs). For example, the level of solar radiation may be a solar irradiance, a power, or any other appropriate measure of solar radiation.

At 1210, the method 1200 comprises capturing multiple sky images by a distributed network of digital cameras. For example, the distributed network of digital cameras may be comprise cameras that are distributed across a city or a geographic region. The cameras in the distributed network of digital cameras may communicate data to a processor (e.g. an internet-connected server) which performs 3D sky modelling and produces forecasts for points or sites of interest. The cameras can be directly internet connected to communicate with the processor, may use peer-to peer networking, such as multi-hop peer-to-peer mesh-based networking, to transfer signals from remote cameras without a direct internet connection (such as those at remote sites). Peer-to-peer networking may also provide redundancy in case a data network becomes unavailable. The digital cameras may comprise image sensors as described hereinbefore. An alignment of the digital cameras may be determined based on a sun or another distant object location in images captured by the digital cameras as described hereinbefore. The digital cameras may comprise wide-angle or fisheye lenses, for example, to allow coverage of a large region of sky. The digital cameras may each comprise weather proofing. In some embodiments, capturing the sky images may comprise capturing multiple images at different exposure parameters and combining the multiple images into a single sky image.

At 1220, the method 1200 comprises determining sun location parameters. In some embodiments, the sun location parameters may be determined as described hereinbefore. In some embodiments, determining the sun location parameters may comprise storing the captured sky images, and determining the sun location parameters based on stored sky images captured at different times of a day, and/or fitting a smoothed curve through sun location points determined from the sky images such that an error between the sun location points and a sun azimuth/zenith model of the sun's rotation is minimised.

The method 1200 comprises generating a three-dimensional (3D) sky model based on the sky images. At 1230, generating the 3D sky model comprises generating 3D object data based on the sky images to model one or more objects in a region of sky. At step 1240, generating the 3D sky model comprises generating position data to model a position of the one or more objects in the region of sky. Generating the 3D sky model may also comprise combining the position data and the 3D object data. The objects may be, for example, clouds, or other objects of interest in the sky.

In one example, the region of sky may be a region covered by a union of the field of views of the digital cameras in the distributed network of digital cameras. In one example, the region of sky may be a region that is with the field of view of at least three digital cameras. In one example, the region of sky may be any region in which one or more objects in the 3D sky model may be determined from the distributed network of digital cameras.

The 3D object data may comprise information regarding a 3D surface of the object. The 3D surface may be a continuous 3D surface. The 3D object data may, for example, comprise information regarding one or more of the following for each of the one or more objects: a continuous 3D surface mesh of the object; a continuous 3D volumetric mesh of the object; a thickness of the object, a 3D shape of the object, a volume of the object, an optical depth of the object, a transmission spectra of the object, polarising or refracting properties of the object.

In some embodiments, the position data is determined via stereographical techniques based on sky images from a multiple cameras to estimate the object's location in 3D space. For example, determining the position data may comprise determining a location and/or an altitude of a base of each of the one or more objects in the region of sky based on the sky images captured by multiple digital cameras. The processor may determine the altitude of each of the one or more objects based on a pixel-shift of each object between sky images from different cameras in the multiple digital cameras. The processor may align the sky images and/or remove lens distortions prior to determining the pixel-shift.

In some embodiments, the position data is determined by other means. For example, in one embodiment, the processor is in communication with a LiDAR system. The processor receives LiDAR measurements of the region of sky captured by the LiDAR system and generates the position data based on the LiDAR measurements.

At 1250, the method 1200 comprises determining a level of solar radiation at the one or more POIs based on the position data and/or the 3D object data of the 3D sky model and the sun location parameters. The POIs may be, for example, a singular point on the ground (such as a known locations of photovoltaics), multiple irregularly distributed points, vertices of a polygonal bounding box, or regular grid points that cover either an area of interest or the total field of view of cameras used to determine the level of solar radiation. In some embodiments, determining a level of solar radiation at the one or more POIs includes generating a binary cloud coverage (occlusion/non-occlusion) map. In one example, the level of solar radiation is a ratio of the maximum solar radiation at that time at that POI given the position of the sun. For example, the determined level of solar radiation is relatively small when a cloud object blocks a path between the POI and the sun. In that case, the level of solar radiation may be considered zero for simplicity. In a different example, the level of solar radiation is a function of the cloud thickness or more accurately, the length of the path between the POI and the sun that lies within the cloud object based on an attenuation parameter.

An advantage of the method 1200 is that capturing multiple sky images by a distributed network of digital cameras may enable information regarding the 3D position of the one or more objects, and 3D information regarding the shape and size of the one or more objects, to be determined. This may enable determination of levels of solar radiation at locations further away from the digital cameras capturing the sky images. By contrast, an image captured by a single camera may only provide accurate forecasts for regions close to the camera, for example, within a few hundred metres. Beyond this, the forecast accuracy may degrade rapidly because clouds observed on a direct line between the single camera and the sun only cast shadows on and immediately around the single camera's location. Further, and in particular when using low-end cameras with limited dynamic range, it is often difficult to capture clouds that are close to the sun due to clipping. Since the cameras in the network can have overlapping fields of view, these clipped pixels of one camera can simply be ignored as they are likely covered by a different camera.

In some embodiments, the distributed network of digital cameras may comprise one or more pairs or sets of digital cameras capturing sky images of a region of the sky. The digital cameras in each pair or set of digital cameras may be spaced apart by between 100 metres and 2 kilometres, for example, to provide a sufficient parallax at a typical cloud height to determine the position data. Pairs or sets of digital cameras may be spaced by between 2 and 20 kilometres from other pairs or sets of digital cameras, for example, to enable cameras to capture a side view of clouds such that 3D object data for the clouds can be determined. This may allow accurate 3D object modelling using stereo within each pair or set of digital cameras, and also wide coverage by using multiple pairs or sets of digital cameras with a small amount of overlapping field of view between sets.

Figure 13:
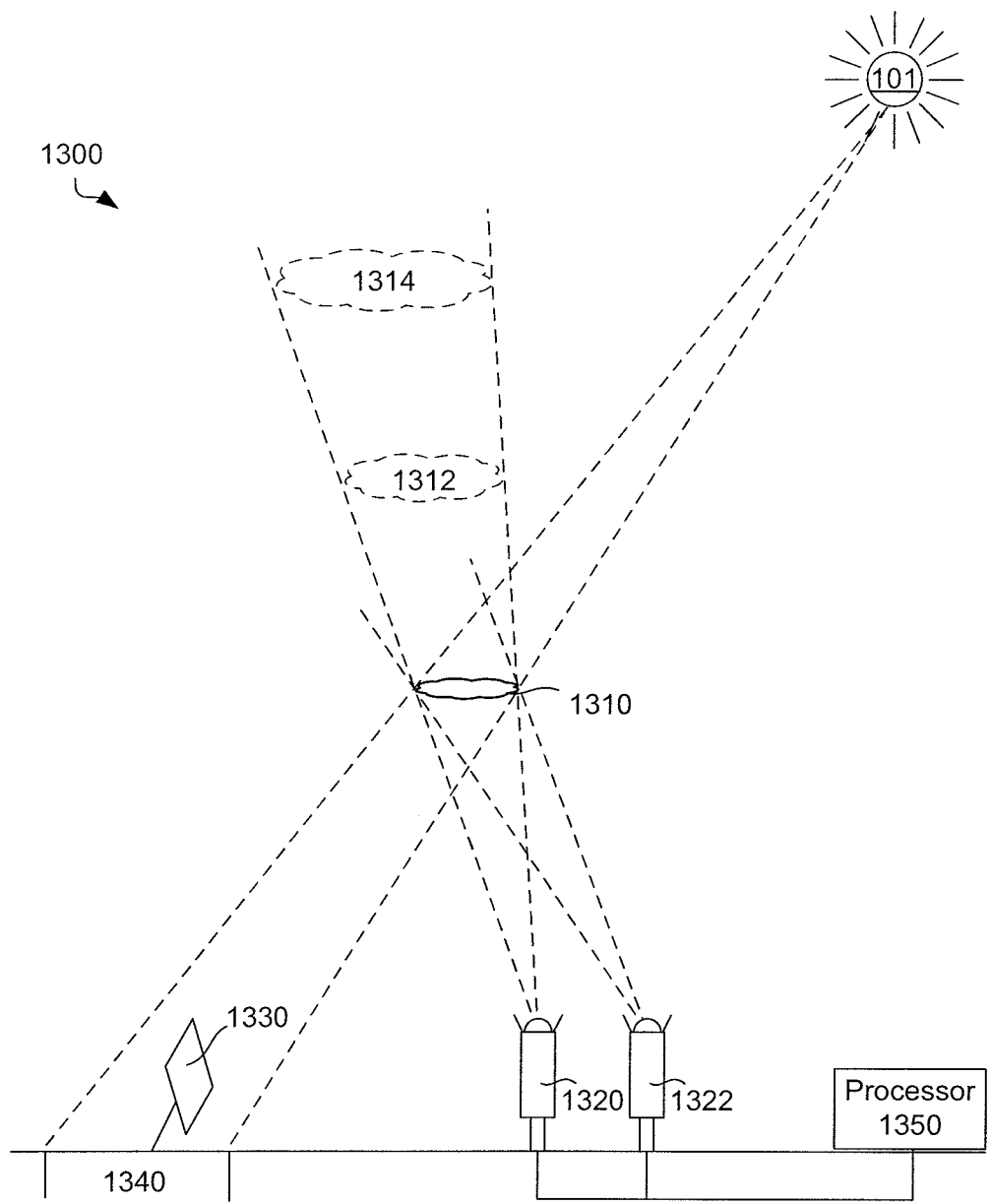
FIG. 13 illustrates an example system comprising a first camera and a second camera to capture images of the sky.

FIG. 13 illustrates an example system 1300 comprising a first camera 1320 and a second camera 1322 to capture images of the sky. For example, the system 1300 may be used to perform aspects of the method 1200. Dashed lines illustrate a view of a cloud 1310 by each of the first camera 1320 and the second camera 1322.

The system 1300 may comprise a processor 1350 that is connected, directly or indirectly, to each of the first camera 1320 and the second camera 1322. The processor 1350 may be configured to receive sky images from the first camera 1320 and the second camera 1322, and determine a position and extent of the cloud 1310 based on the sky images. The processor 1350 may then determine a level of solar radiation at a POI 1330 based on the position of the sun 101 and the position and extent of the cloud 1310.

In the example shown in FIG. 13, a shadow 1340 is shading the POI 1330. As illustrated by a virtual cloud 1312 and a virtual cloud 1314, images of the cloud 1310 captured by only the first camera 1320 may not provide sufficient information to accurately determine the position and extent of the cloud 1310. For example, if the cloud 1310 was incorrectly determined to have the position and extent of virtual cloud 1314, then the processor 1350 may have determined that that the cloud 1310 was not shading the POI 1330. The processor 1350 may also have made incorrect forecasts of the level of solar radiation at the POI 1330 if the cloud 1310 were incorrectly determined to be virtual cloud 1314 because other details of the cloud 1310 such as its velocity or type may have been determined incorrectly.

Figure 14:
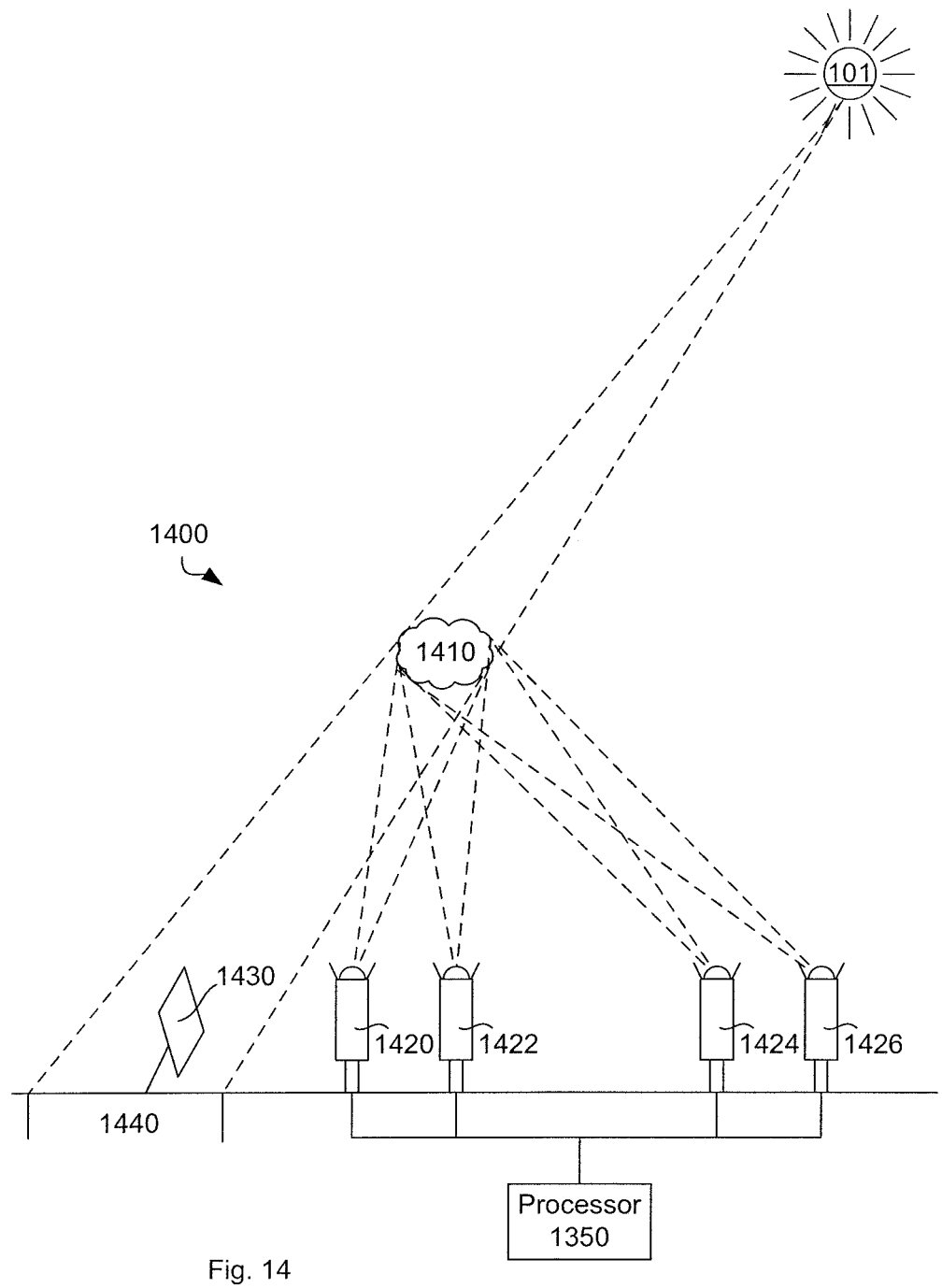
FIG. 14 illustrates an example system comprising a first camera, a second camera, a third camera and a fourth camera to capture images of the sky.

FIG. 14 illustrates an example system 1400 comprising a first camera 1420, a second camera 1422, a third camera 1424 and a fourth camera 1426 to capture images of the sky. For example, the system 1400 may be used to perform aspects of the method 1200. Dashed lines illustrate a view of a cloud 1410 by each of the first camera 1420, the second camera 1422, the third camera 1424 and the fourth camera 1426.

The system 1400 may comprise a processor 1350 that is connected, directly or indirectly, to each of the first camera 1420, the second camera 1422, the third camera 1424 and the fourth camera 1426. The processor 1350 may be configured to receive sky images from the first camera 1420, the second camera 1422, the third camera 1424 and the fourth camera 1426, and determine a position of the cloud 1410 based on the sky images. The processor 1350 may also be configured to determine 3D object data for the cloud based on the sky images, such as a continuous 3D surface mesh of the cloud; a continuous 3D volumetric mesh of the cloud; a thickness of the cloud, a 3D shape of the cloud, a volume of the cloud, and/or an optical depth of the cloud.

The processor 1350 may determine a level of solar radiation at a POI 1430 based on an estimated position of the sun 101, the position and size of the cloud 1410, and the 3D object data. In the example shown in FIG. 14, the cloud 1410 is shading the POI 1430.

An advantage of using multiple pairs or sets of cameras is that the 3D object data enables a thickness dimension of the cloud to be included in the 3D sky model. This may allow more accurate ray tracing and determination of the level of solar radiation at the POI, particularly where the cloud is a tall cloud and the cloud is not directly between the cameras and the sun. This may also increase forecast accuracy because the multiple pairs or sets of cameras provide different perspectives of the same objects. For example, the thickness of a tall thin cloud (or any substantially 3-dimensional object) is difficult to determine accurately from a pair of cameras that is underneath it. Such inaccuracies could lead to errors in the ray tracing using the 3D sky model. However, when viewed from the side by a second pair or set of cameras further away, the thickness of the cloud can be accurately determined, allowing more information to be added to the 3D sky model, improving forecast accuracy. Addition of further pairs or sets of cameras may increase the accuracy of the 3D model and hence further increase the accuracy of forecasting the level of solar radiation at POIs.

While a cloud has been shown as an example in FIG. 14, similar techniques may be applied to model other objects in the sky to determine the level of solar radiation at a POI. For example, in some applications smoke clouds may be tracked to model bushfires Examples of image processing of the captured sky images is detailed below. Such image processing may be used in the embodiments described herein.

Lens Distortion

If a fisheye lens is used, size related quantities may be difficult to directly compute from the sky images. Two examples of such quantities are the dimensions of a cloud and the apparent horizontal distance between a cloud and the sun. In some embodiments, the processor undistorts the image using the lens properties of the camera such that size related quantities can be computed directly from the images. Alternatively, size related quantities could be derived using the parameters of the fisheye lens to determine the size of each pixel in the image and in turn computing the size related quantities with this knowledge using look up tables. In one example, fisheye distortion for the lens of the cameras is characterised by spherical distortion equations. For example, the parameters which model the lens distortion may be determined by taking images of a checkerboard, determining grid corners and using them to estimate the equation of a straight line in undistorted space.

Filtering

The undistorted sky images may be converted into images of intensity or brightness. The intensity transformation forms part of the Hue, Saturation and Brightness (HSV) transformation that is often used for colour quantification and image editing. Intensity is defined, for each pixel in an image, as the average of the 3 colour channels, red, green and blue. Transforming in to this single channel representation allows the processor to discriminate between bright clouds and sky using a threshold on the intensity values. While dark clouds may be confused with sky, clouds near the sun are likely to have bright cloud edges illuminated by the sun.

The processor may apply a blurring filter to the single channel images. This stage of filtering removes artefacts from image compression and smoothes intensity levels so local pixel neighbourhoods are not broken up in the thresholding process. In one example, the processor applies a blurring filter by convolving the single channel image with a 2D Gaussian function. Alternatively, the processor may apply a box filter where each pixel is replaced by the average of its neighbours. However, box filters tend to impact on the morphology of the objects in the sky images. In some embodiments, because a Gaussian blur can be an expensive operation in terms of processing time, the processor may apply an approximation to the Gaussian blur such as the one described in Deriche (Deriche, R. (1993). *Recursively implementing the Gaussian and its derivatives*. INRIA). This filter is parameterised by the standard deviation of the Gaussian function. In one example, the processor may apply the Deriche filter with a standard deviation of 2 pixels to balance the removal of noise and the preservation of the smallest clouds that could shade the sun.

Thresholding

The processor may determine objects in the image that are brighter than the background (i.e. have a higher pixel value). For example, the processor may assign a pixel to being part of an object if the value of the pixel is greater than a predetermined threshold value. A pixel failing this criteria is assigned to the background. There are many algorithms to automatically determine a threshold value based on image content such as that described in Otsu (Otsu, N. (1979). A threshold selection method from gray-level histograms. *IEEE Transactions on Systems, Man and Cybernetics*, 62-66).

As the sky images may vary from having no clouds through to complete cloud cover, in some embodiments the processor may determine a threshold value based on the sky image. In some embodiments, a fixed threshold value is used. For example, the fixed threshold value may be 200 and may be applied to the blurred intensity image described in the filtering section above. This threshold value was determined empirically by examining the output of many sky images. However, the threshold value may be a user adjustable parameter that may be adjusted during calibration to suit camera characteristics and application needs.

It is noted that while thresholding may exclude dark clouds that do not satisfy the threshold criteria, detecting bright edges of such clouds which are oriented toward the sun may be sufficient for cloud detection purposes, especially given that the cloud formations of most interest only occur in a specific set of weather conditions—namely relatively clear sky in areas close to the sun's coordinates.

Alignment

In some embodiments, generating the 3D object data and/or the position data includes aligning the sky images, via the processor 1350, based on the sun location parameters and/or the sky images. For example, the processor 1350 may 3D rotate the sky images from one of the cameras to align them with sky images from another one of the cameras based on an identification of the sun in the sky images and the sun location parameters. This may compensate for imperfect camera installation (e.g. tilt and orientation) and lens flares (from smudges and dust on the lens). The processor may use a sun azimuth/zenith model and a numerical optimisation to accurately fit a smoothed curve to the sun's location over time in sky images from both cameras separately. For example, the processor may determine the sun's path based on stored images captured over a day. The processor may then determine a relative alignment of the cameras as described hereinbefore. The processor may apply geometric transformations to the sky images to precisely align the curves based on the images from both cameras. Where the cameras comprise a fish-eye lens, the processor may 3D rotate and/or process the sky images in a fish-eye space, or transform the images as described above.

FIG. 15 illustrates a method 1500 for determining the level of solar radiation at the POI.

At 1510, the method 1500 comprises computing a light path between the POI and a location of the sun based on the sun location parameters.

At 1520, the method 1500 comprises determining if the one or more objects modelled in the 3D sky model occludes the light path.

At 1530, the method 1500 comprises determining the level of solar radiation at the POI based on a level of occlusion of the light path by the one or more objects.

FIG. 16 illustrates a method 1600 for generating the 3D object data according to some embodiments.

At 1610, the method 1600 comprises generating separate 3D models based on the sky images captured by each pair or set of digital cameras. For example, each model may be generated via stereography based on the sky images from the respective pair or set of cameras. The model may be defined in 3D space and determined based on the alignment of the sky images. The model may also be determined based on other factors such as relative positions and/or orientations of the cameras, and/or other properties of the cameras. In one example, the model comprises a 3D point cloud or 3D mesh.

At 1620, the method 1600 comprises merging, via the processor, separate 3D models to generate a 3D sky model of the region of the sky. Merging the separate 3D models may comprise the processor matching features between the separate 3D models and aligning the 3D models, if required. When merging the 3D models, the processor may resolve conflicting data in overlapping areas of the separate 3D models, for example, by discarding data that are inconsistent with models generated from other pairs or sets of cameras.

In one example, the separate 3D models are sparse models, and generating 3D object data comprises the processor merging separate sparse models on demand to generate a surface or volumetric patch for the region of sky between the POI and the sun. The processor may then determine the level of solar radiation at the POI via a ray trace based on the surface or volumetric patch.

The sparse model may be a set of sparsely distributed data points, which are determined by refining cloud height data derived from a pair or set of cameras. In the absence of any cloud, the processor may set the cloud height as a special (e.g. negative) value. Generating a surface or volumetric patch may comprise the processor mapping a 3D surface onto the model. Performing this mapping on an on-demand basis reduces the amount of computation needed by not expending computing power calculating the surface for the whole region of sky in high-resolution ahead of time. The reduced burden on the processor may also enable the surface or volumetric patch to be generated in higher resolution as the processor may only need to generate the surface for a small patch where projected rays between the POI and the estimated position of the sun will intercept the model. In the case of a LiDAR extrapolation, only the cloud height at a single point may need to be determined by the processor.

In some embodiments, 3D meshes are used instead of a 3D point clouds. A similar method to the method 1600 may be used in relation to the 3D meshes, and surface or volumetric patches may be created based on the 3D meshes.

Determining the 3D point clouds or 3D meshes may comprise the processor receiving data captured by satellite measurements, such as object thickness, spectral measurements of the object or object reflectivity The 3D point clouds or 3D meshes may comprise a high resolution continuous surface or volume indicating the 3D coordinates of many points on the object. An advantage of generating a continuous 3D surface point cloud or 3D mesh surface or volume is that an object's shadow position on the ground can be determined more accurately due to the increased resolution of the object that is provided. The use of 3D point clouds or 3D meshes is distinct from methods which only determine an averaged object base altitude on a horizontal plane for an object as a whole, or for a large group of objects. The additional 3D information provided, such as the thickness and volume of tall and thick clouds can be taken into account when determining shadow positioning. These features are particularly important for accurate solar irradiance and power forecasting at POIs which are distant from the set of cameras.

Figure 17:
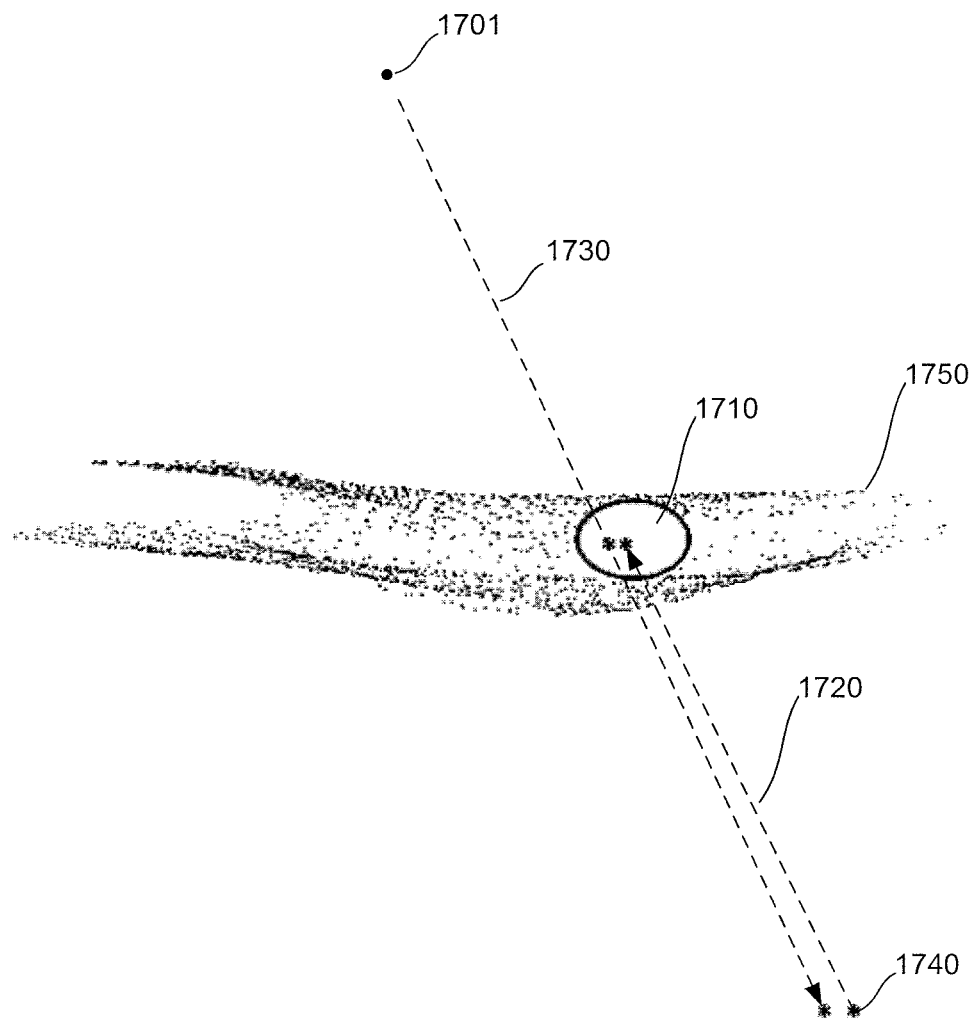
FIG. 17 illustrates a determination of the level of solar radiation at a POI.

FIG. 17 illustrates a determination of the level of solar radiation at a POI 1740. The processor generates a surface patch 1710 on a virtual line 1730 between one or more POIs 1740 and an estimated location 1701 of the sun. The processor performs a ray trace 1720 in a reverse direction from a POI 1740 toward the estimated location of the sun 1701 and determines the level of solar radiation at the POI 1740 based on the ray trace 1720 and the surface patch 1710. If the processor determines that the ray intersects the surface patch 1710 (that is there is predicted to be an object between the POI and the sun), then the processor determines that the POI on the ground is in shadow.

Where the cameras are a significant distance from the POI (e.g. when the sky is observed from a different town), the processor may apply a correction by translating the 3D sky model or the intersection point by an equivalent distance in an opposite direction.

In some embodiments, the processor generates a control signal to control a solar power system, such as a photovoltaic system or a solar thermal system, based on the determined level of solar radiation at the POI. For example, a processor may generate a control signal to control an inverter output to adjust ramp-rates in an electrical grid, control energy storage charge and discharge rates and timing, control the rate and timing of energy consumption of one or more electrical devices, control one or more electrical devices to provide voltage, frequency and network services to the electrical grid, and/or control a generator to compensate for a reduction of performance caused by a cloud cover reducing level of solar radiation of the solar power system. In some embodiments, the number of sky images captured by the network of distributed digital cameras may be such that an accuracy of the determined level of solar radiation is sufficient for generating a control signal that compensates for a difference between a power demand and a predicted solar power performance.

In some embodiments, the processor determines a network of digital cameras to estimate a performance of a solar power system based on the predicted level of solar radiation as described hereinbefore. For example, the processor may determine the network of digital cameras at least by determining the number and/or location of digital cameras that reduces the difference between a predicted performance and an actual performance of a solar power system. This allows the distributed network of digital cameras to be optimised for controlling the solar power system.

Figure 18:
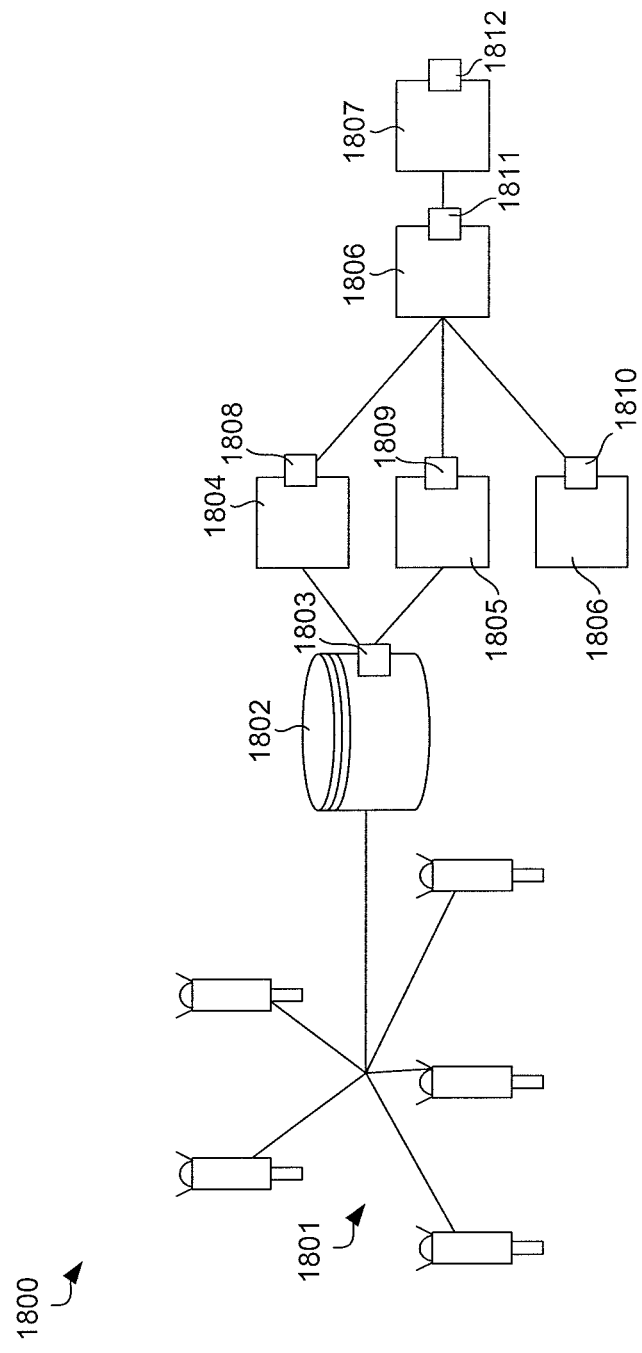
FIG. 18 illustrates a solar energy harvesting system.

FIG. 18 illustrates a solar energy harvesting system 1800 comprising a distributed network of digital cameras 1801, an image database 1802 having a database interface 1803 and connected to the distributed network of digital cameras, a 3D object data generation unit 1804 connected to the database interface 1803, a position data generation unit 1805 connected to the database interface 1803, a sun location generation unit 1806, a solar radiation determination unit 1806 and a control unit 1807.

When in use, the distributed network of digital cameras 1801 captures multiple sky images as described herein. The image database 1802 receives sky images from the distributed network of digital cameras 1061, stores the sky images and provides the sky images on the database interface 1803. The database 1802 may be a SQL or other relational database or simply a file system with jpg files or files in other formats stored thereon. In the latter case the database interface 1803 would be a file system interface, such as an interface provided by an operating system to access files on a hard drive, for example. The database 1802 may fully reside in RAM to increase memory access speed.

3D object data generation unit 1804 retrieves multiple sky images and comprises a 3D object data output interface 1807. 3D object data generation unit 1804 further determines 3D object data describing one or more objects in a region of sky based on the sky images and provides the 3D object data on the 3D object data output interface 1808.

Position data generation unit 1805 comprises a position data output interface 1809. Position data generation unit 1805 further retrieve multiple sky images from the image database through interface 1803 and generates position data to model a position of the one or more objects in the region of sky and provides the position data on the position data output interface 1809.

Sun location generation unit 1806 comprises a sun location output interface 1810 and provide sun location data on the sun location output interface 1810.

Solar radiation determination unit 1806 is connected to the 3D object data output interface 1808, connected to the position data output interface 1809 and connected to the sun location output interface 1810. Solar radiation determination unit 1806 also comprises a solar radiation level output interface 1811 and is configured to determine a level of solar radiation at the POI based on the position data, the 3D object data and the sun location parameters and to provide the level of solar radiation on the solar radiation level output interface 1811.

Control unit 1807 is connected to the solar radiation level output interface 1811 and comprises a control output 1812. Control unit 1807 generates a control signal based on the determined level of solar radiation on the control output 1812.

The structure of system 1800 implements the functions described herein in the sense that the description provided in this disclosure applies to the elements in FIG. 18. The units 1804-1807 may be implemented in various different ways which also affects the implementation of the interfaces 1808-1812. For example, the units 1804-1807 may be implemented as application specific integrated circuits connected by wires to each other. In that example, the interfaces 1808-1812 may be bus drivers or other output drivers that amplify a logic value provide by the circuit. In other examples, the units 1804-1807 are software modules, such as classes of an object oriented programming language. In that example, the interfaces 1808-1812 may be class interfaces, such as functions providing access to class attributes. Other ways of implementing system 1800 are also within the scope of this disclosure.

In some embodiments, one or more of the digital cameras may be co-located with, and configured to control, one or more of the following: a rooftop solar array; a photovoltaic field; a solar thermal field. In some embodiments, one or more of the digital cameras may be co-located with, and receive data from, one or more of the following: a LIDAR; an irradiance sensor; a weather sensor.

Predicting Evolution of Sky Model

In some embodiments, the 3D sky model is evolved based on the sky images to predict a future level of solar radiation at the POI. In one example, the processor estimates a future position, size and/or shape of each of the one or more objects by extrapolating a past position, volume, optical depth and/or velocity of the object. The processor then forecasts a future level of solar radiation at the POI. Where a point cloud is used, the processor may determine an estimated evolution of the point cloud.

In some embodiments, the processor determines cloud formation and/or advection parameters based on the 3D sky model. For example, the processor executes a cloud formation detection algorithm as described hereinbefore. The detection algorithm may detect the appearance of clouds forming or dissolving in areas of clear sky (a process known as advection). Such clouds often form directly over the sun, and cannot otherwise be predicted through projections of cloud movement. Such clouds may be a source of forecast error if unaccounted for.

The processor may then determine the level of solar radiation based on the cloud formation and/or advection parameters, and other data in the sky model. For example, the processor may identify types of clouds and/or changes in clouds based on the 3D sky model and use this knowledge to determine an evolution of clouds in the sky. In some embodiments, the processor may determine the level of solar radiation at the POI based additionally on satellite imagery, numerical weather forecasts, weather observations; and measurements of distributed solar power generation. For example, the processor may determine based on the measurements of solar power generation at a site that an object exists, such as a tree, that will shade the POI when the sun is at certain locations.

Merging and Labelling

Figure 19A:
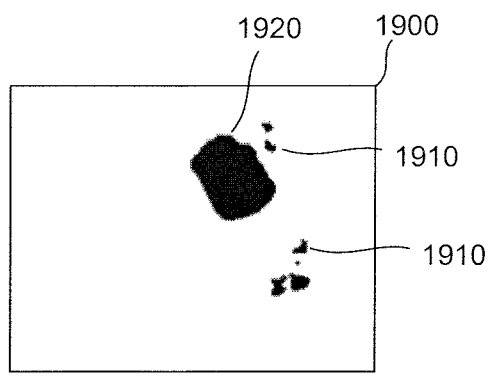
FIG. 19A illustrates an example thresholded sky image.

The processor may identify separate objects in the sky images and label each separate object in the sky images with a unique identifiers. FIG. 19A illustrates an example thresholded sky image 1900. The thresholded sky image 1900 shows small clouds portions 1910 close to a larger cloud portion 1920. Given the variable brightness in the sky images, such small clouds portions are often identified near a larger cloud portion. Giving these small objects unique identifiers and tracking them through subsequent stages of processing may place an unnecessary burden on the processor, and serves negligible purpose for detecting cloud formation. Therefore, the processor may merge such "satellite" objects into nearby larger clouds by morphologically closing the gap between the objects with a polygonal structuring element with radius of, for example, 10 pixels. In the case where the small object is spatially localised, the closing process will merge the objects together to form a single object.

Figure 19B:
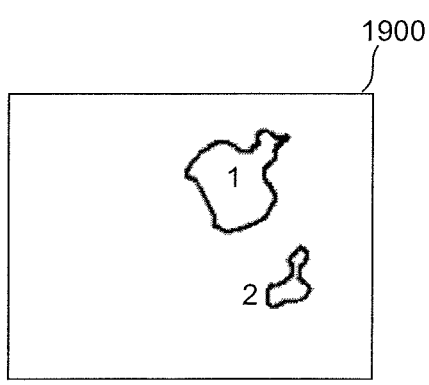
FIG. 19B illustrates separate objects identified by the processor in the sky image.

FIG. 19 B illustrates separate objects identified by the processor in the image 1900, for example, via a connected components process which groups together touching foreground pixels. The processor has identified a first object labelled as "1", which includes the large cloud portion and surrounding small cloud portions, and a second object labelled as "2", which includes a group of small cloud portions.

Object Tracking

The detected and labelled clouds provide a framework to assess the evolution of individual clouds for the purpose of generating warnings for cloud formation over the sun. The key component for this assessment is the ability to track individual clouds on a frame to frame basis over time based on the sky images. The processor may track clouds from frame to frame by searching for overlapping pixels in the labelled images from one frame to the next.

Figure 20A:
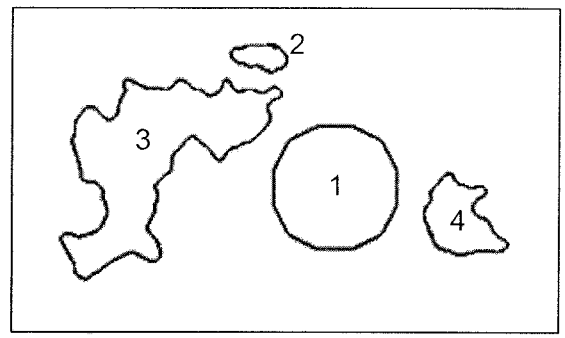
FIG. 20A illustrates a sky image from a camera.
Figure 20B:
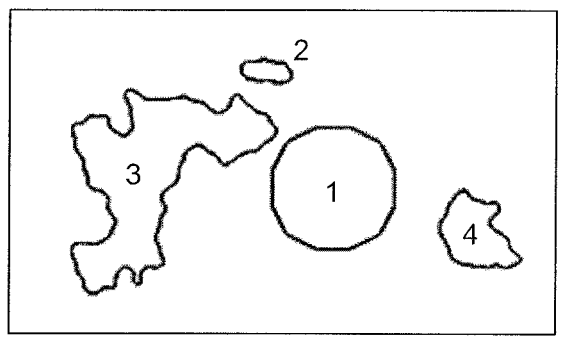
FIG. 20B illustrates a second image captured 10 seconds later by the camera.
Figure 20C:
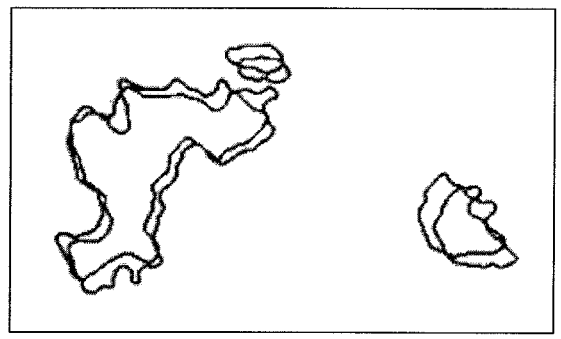
FIG. 20C illustrates objects evidencing partial overlap between the captured images shown in FIG. 20A and FIG. 20B.

FIG. 20A illustrates a first frame that comprises objects labelled "1" to "4", where the object labelled "1" is the sun and the objects labelled "2"-"4" are clouds. FIG. 20B illustrates a second frame captured 10 seconds later. FIG. 20C illustrates that each object overlaps between frames so is considered to be the same object by the processor. By scanning the overlapping region, the processor can determine the parent child relationships between the objects in each subsequent frame and track an evolution of the objects.

If objects fuse together, the processor may assign the label of the largest object involved in the fusing to the new fused object. The processor may determine the parents of a fused object via a bivariate histogram of the co-occurrence of pixels belonging to label pairs within each overlap region. If objects split apart, the processor may assign new labels to the split objects and link these objects to their parent.

The processor may extended the tracking of the parent child relationships to multiple frames by simply storing the relationships from previous pairs of frames.

FIGS. 21A to 21E illustrate an example object tracking over five frames (images). Objects in each image are labelled with values which may be reassigned as objects appear or disappear from the image, or merge or split apart between frames. A tracking of each object is shown in Table 1, where each row represents labels of an object as it evolves in the images and each column represents a frame.

TABLE 1

Labels of objects tracked over frames shown in FIGS. 21A to 21E

| Label frame(i-4) | Label frame(i-3) | Label frame(i-2) | Label frame(i-1) | Label frame(i) |
|---|---|---|---|---|
| 1 | 1 | 1 | 1 | 1 |
| 2 | 2 | 2 | 2 | 2 |
| 2 | 2 | 2 | 2 | 3 |
| 4 | 4 | 4 | 3 | 4 |
| 0 | 0 | 0 | 4 | 5 |

The object labelled "1" in each frame is the sun. An object labelled "2" in frame i-4 (shown in FIG. 21A) is a cloud and increases in size over the first four frames (i-4 to i-1) before it splits into two clouds labelled "2" and "3" in frame i (shown in FIG. 21E). This evolution is represented in the second and third rows of Table 1. The second row of Table 1 has a label "2" in each cell, indicating that object "2" in each frame has descended from object "2" in the previous frame. The third row shows that object "3" in frame i also descended from object 2 in frame i-1.

Figure 21A:
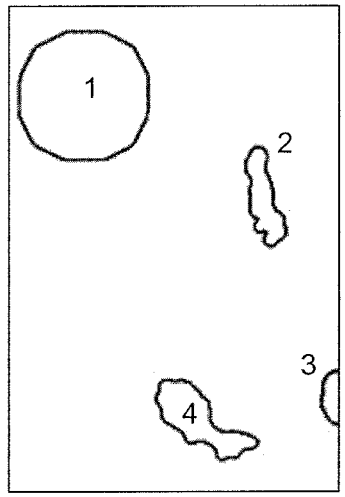
FIGS. 21A to 21E illustrate an example object tracking over five frames (images).
Figure 21B:
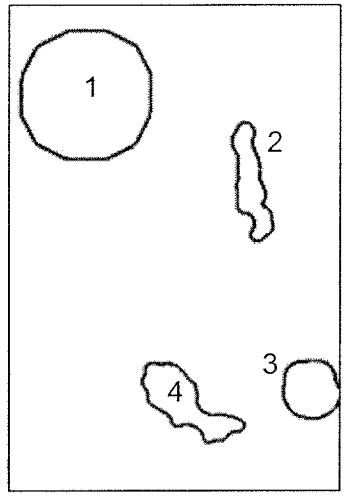
Figure 21C:
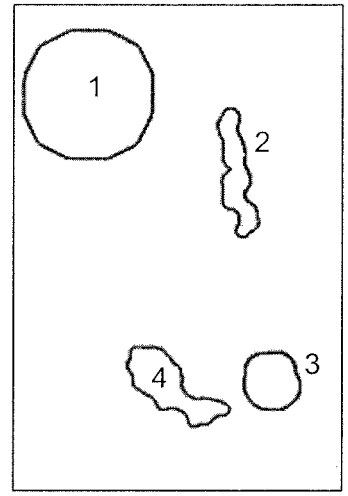
Figure 21D:
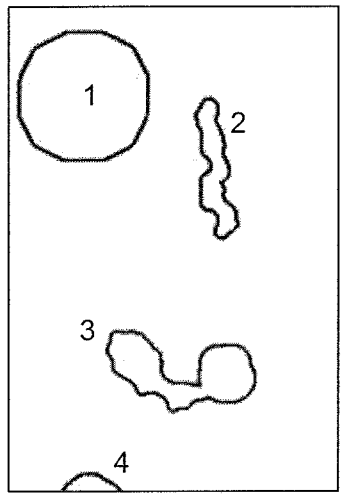
Figure 21E:
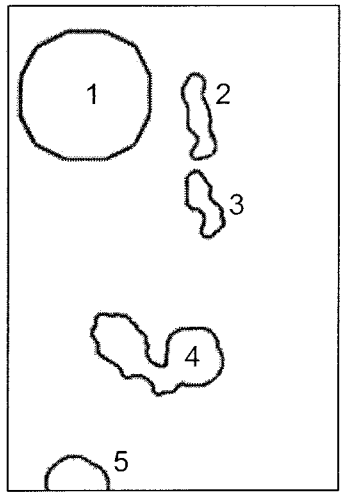

An object labelled "4" in frame i-4 (shown in FIG. 21A) is a cloud and merges with an object labelled "3" that is also a cloud between frame i-2 (shown in FIG. 21C) and frame i-1 (shown in FIG. 21D). This is shown in row 4 of the table. In the example shown in Table 1, the evolution of the two objects before the merge is not propagated beyond the frame at which the merge occurs. Only the label of the largest cloud before the merge is retained in the family history. Object "5" in frame i (shown in FIG. 21E) descends from object "4" in frame i-1 (shown in FIG. 21D) and before that, it was not visible. Where the object was not visible a label of "0" is assigned in Table 1.

Attribute Measurement

In some embodiments, the processor tracks objects in the images based on attributes of the object. The processor may measure a size attribute which represents, for example, the extent of the object in the view of the camera. The processor may apply a transformation to the image to adjust for lens distortion, such that each pixel represents a square region of equal size, as discussed hereinabove. The processor may then estimate the size of an object based on the count of the pixels within an identified object, including object boundaries. As the size of each objects is measured in pixels, the processor may not need to convert the measured size to a real world distances such as metres. The processor may store the measured size of each object such that it is associated with the label for the object in the respective image.

The processor may determine a growth attribute based on the size measurement in multiple frames. The growth attribute may be used to capture whether an object, such as a cloud, is growing or shrinking. For example, the processor may determine the growth attribute as the size of the child object divided by the size of its parent object. If the growth attribute is greater than 1, the object is increasing in size, and if the growth attribute is less than 1, the object is decreasing in size.

The processor may determine a "distance from sun" attribute for each object. The sun may be identified by the processor, for example, by determining an object in the frame that has a predetermined pixel radius, such as 50 pixels, around a sun centre position predicted from the sun location parameters. The processor may determine the distance from sun attribute based on an edge to edge distance between the sun object and unique cloud objects, for example, in pixels. This may allow determination of when clouds of a variable size might first obscure the sun.

In one example, determining the distance from sun attribute comprises determining a distance transform for the sun object that assigns a distance to the sun object from each pixel in an image that does not belong to the sun object. In some embodiments, the processor may first determine the pixels touching the sun on a priority queue and "pop" successive pixels off the queue based on distance. The processor may determine a distance for each object based on a minimum distance from the sun object to a pixel of the object.

The processor may determine a lifetime parameter being a time over which an individual cloud has been tracked through the system. The processor may determine the number of frames for which each object has been tracked by searching for a last zero valued frame for the object. The number of frames for which an individual cloud has been tracked may be used by the processor to screen out noisy, non-persistent cloud detect-events. The processor may threshold objects based on the number of frames for which the objects have been tracked. For example, the processor may only consider a subject cloud as an advection event once the cloud has persisted for a threshold number of frames. A by-product of this is that the processor may only need to retain a family lineage for the object for this number of frames plus 1.

Decision Making

The processor may determine whether a frame contains a cloud formation event that can be reported to controlling equipment in an electrical grid, based on the above attributes. In one example, the processor applies two decision rules for each frame. The first rule uses four thresholds: size_a, track_l, growth_t and dist_s. The size_a threshold is the minimum acceptable size of a cloud for it to be considered and is set to 125 pixels. The track_l threshold is the number of frames over which a cloud has been tracked before it can be considered and is set to 5, which corresponds to 50 seconds for image collection at 10 frames per second. The growth_l threshold is set to 1 and a clouds growth attribute needs to be larger than this value to be considered by the processor. Finally, dist_s is a threshold for the distance of the cloud to the sun. This value is set to 400 pixels and the distance to the sun for an individual cloud needs to be less than this value for it to be considered by the processor. If all of these requirements are satisfied, the processor reports a cloud formation event to the electrical grid.

The second rule is designed to give an earlier warning if a large cloud forms quickly. In essence, the processor may ignore the requirement regarding the number of frames over which a cloud has been tracked if a cloud is large. In one example, the processor applies a second size based threshold, size_b. The processor then determines a formation event has occurred if the growth_l, dist_s thresholds are satisfied along with the size of the cloud being larger than size_b, which is set to 450 pixels.

The application of these rules by the processor can be useful in guiding direct decision making in electrical grids, for example in the case of probable loss of solar power, and providing a transparent method of warning of conditions which are difficult to detect with traditional sky-camera forecasting methods. Control decisions that can be made using the cloud formation decision could include, for example: starting a controllable (typically fossil-fueled) generator or increasing the spinning reserve, curtailing the solar power generation, curtailing controllable load, and/or charging an energy storage device prior to a shade event.

Sun Location

The processor may be configured to automatically detect the sun location in frames. In some embodiments, the processor may be configured to automatically detect the sun location for only clear sky frames. This may avoid errors that would be introduced by using frames that contain a large amount of cloud interacting with the sun.

Figure 22:
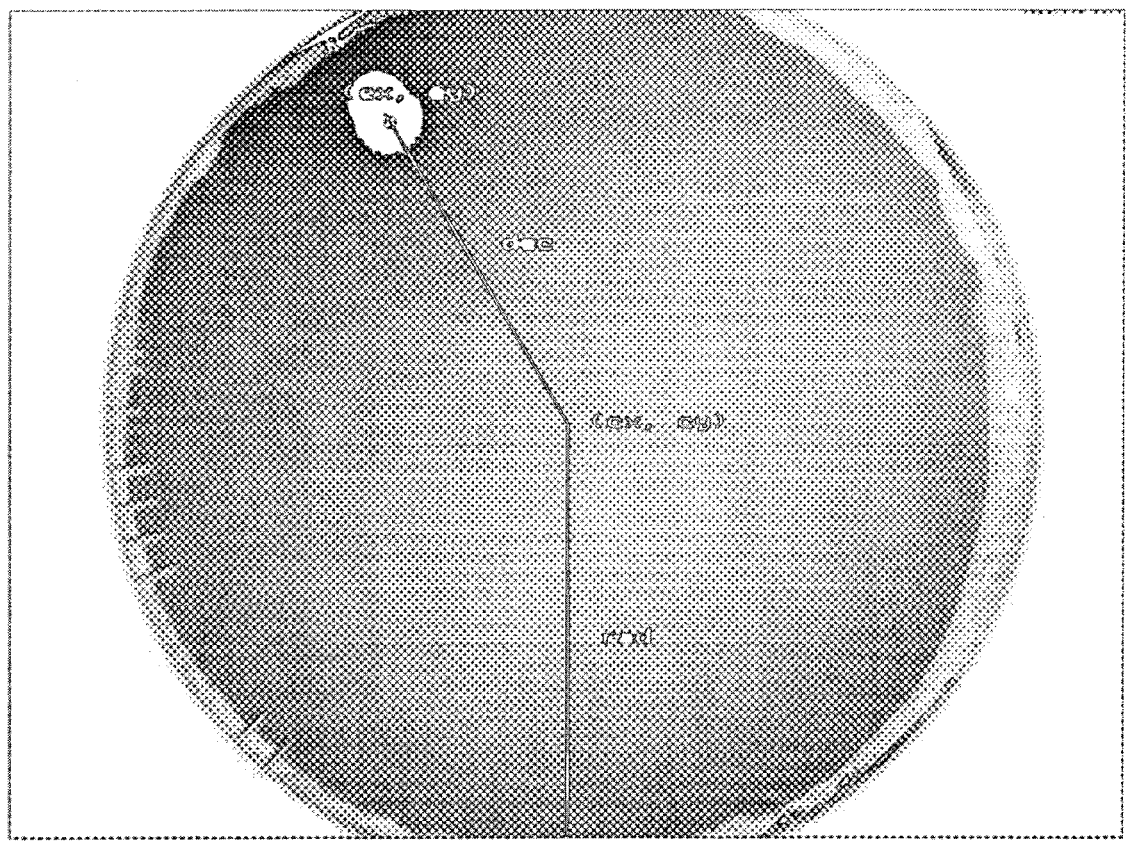
FIG. 22 illustrates pixel coordinates defined by a processor to determine a sun location.
Figure 23:
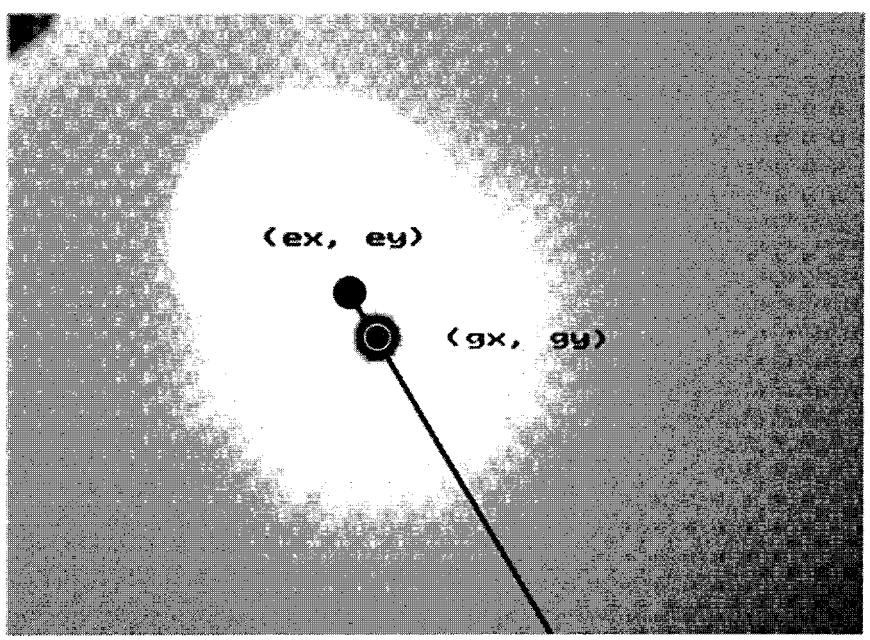
FIG. 23 illustrates a determination of a sun location.

In one example, the processor converts the sky image into a single channel representation of intensity and applies a Gaussian blur as described hereinabove. The processor may then apply a Gaussian blur with a large standard deviation, for example, equal to the number of rows in the image divided by 60. Parameterising this operation against the image dimensions may make it robust to changing image resolution for different hardware as the number of rows may roughly corresponds to a horizon to horizon distance for a fish eye lens. The use of heavy blurring removes noise and other artefacts. It also preserves the sun as the dominant bright feature of the image with a single maximum point with regard to pixel intensity. The processor determines a centroid of maximum image intensity as an initial estimate of sun position. The processor may define the centroid by its pixel coordinates, for example, (ex, ey) shown in FIG. 22. The centroid is not guaranteed to be a single pixel, rather a collection of connected pixels with the same intensity value.

In some embodiments, where the camera renders the centre of the sun as a darker spot, the processor determines a ground truth sun position (gx, gy) based on the location of the dark spot. While estimates of the sun's location are typically correct for midday sun in summer months, they may be inaccurate at other times, at least due to the lens distortion of the fish eye lens. It was found that the estimate could be adjusted using the distance to a centre of the image (cx, cy) relative to the distance from the horizon to the centre of the image, dec. dec may be computed by the processor as follows:

$$dec = \sqrt{(cx-ex)^2 + (cy-ey)^2}/rad$$

where rad is the distance from the horizon to the centre of the image calculated as the number of rows in the image divided by 2. The processor may also calculate the relative distance between (gx, gy) and (cx, cy), dgc as follows:

$$dgc = \sqrt{(cx-gx)^2 + (cy-eg^2)}/rad$$

Using our ground truth data, the processor may then model the sun location as follows:

$$(dgc)^2 = \alpha * (dec)^2$$

which approximates the spheroidal nature of the lens distortion.

The processor may then compute the relative distance between a final sun position (sx, sy) and (cx, cy), dsc as follows:

$$(dsc)^2 = \alpha * (dec)^2$$

Finally, the position (sx, sy) is determined as dsc pixel units from (cx, cy) along the line between (cx, cy) and (ex, exy).

This method of determining the sun's position in a single image was then used to automate the calibration of the sun position tracking method described hereinbefore. By automatically determining the sun's location in an image, the processor may process the images automatically without the need for user input.

As noted earlier, the sun's position can be determined from a clear sky image, but the presence of clouds or other unexpected objects may cause an incorrect output. The processor may account for this by applying filtering to the sun location points determined above.

In a first example, it was observed that the distortion at the very edges of the fisheye lens made it difficult to accurately identify the location of the sun. The processor may be configured to remove points determined to be near the horizon, for example the processor may exclude points that are more than a predetermined angle from the zenith. In one example, it was empirically determined that removing points more than 75 degrees away from the zenith was sufficient to remove the majority of points affected by this problem.

Figure 24:
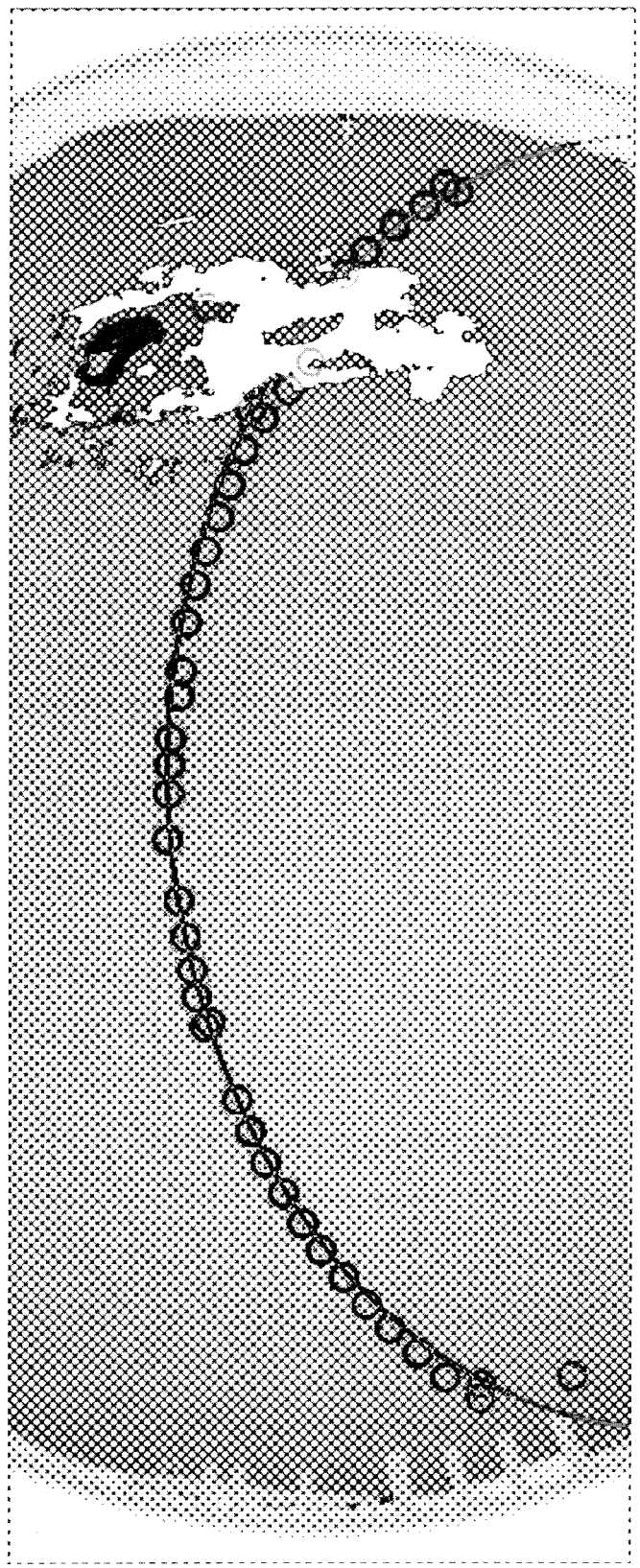
FIG. 24 illustrates a tracking of a sun location with sun location points defined over a day.

In a second example, it was observed that even on so-called clear sky days, it was fairly common for a cloud to cover the sun temporarily, causing an erroneous identification of the sun position. The processor may be configured to analyse the points as a time series, based on the sun's path over a day forming a smooth curve as illustrated in FIG. 24. Outlier points that stray too far from the smooth curve may be removed by the processor before running an optimiser to optimise the curve as described hereinbefore. The removed outlier points have left spaces in the time series illustrated in FIG. 24.

The processor may detect outlier points caused by small clouds on otherwise clear sky by comparing the angles between the points and adjacent points. If the processor determines that a change in angle is greater than a threshold, the point may be marked as an outlier. In testing this was sufficiently accurate to remove the majority of outlier points on otherwise clear days.

The above method of removing outliers may also be used by the processor for detecting overcast days. For example, on an overcast day, the processor may incorrectly detect the suns location based on other bright points in the picture. If the processor determines that greater than a threshold number of points are marked as outliers, the processor may discard all points from the day, because the day is assumed to be overcast and therefore not suitable for mapping the sun's location.

As detailed above, once the processor has determined the sun location, the processor may approximate a boundary of the sun in each image by morphologically dilating a pixel at the sun location with a polygonal structuring element with radius 50 pixels. This operation approximates a circle centred at the sun location and the processor can use this as a mask to exclude pixels from further processing steps.

Masking

In some embodiments, the processor may mask unwanted features in the sky images prior to generating the point clouds and/or the sun location data. This may eliminate the processing of areas of the sky images that are not sky. For example, in some situations, the digital cameras in the distributed network of digital cameras may have parts of the ground or fixed objects extending from the ground in their field of view. The processor may analyse stored sky images captured during a period of time, such as a day. The processor may then apply a black/white mask which removes pixels determined to be below the horizon or fixed objects such as trees and antennas. In one example, the processor determines that a first group of pixels in the sky image are below the horizon, then the processor masks the first group of pixels in the sky image. In another example, the processor determines that a second group of pixels in the sky image correspond to a fixed object. The processor then masks the second group of pixels in the sky image, for example, to prevent the pixels being interpreted as an object in the sky.

In one example, the processor performs masking of an individual frame as follows. Firstly, the processor produces a background image which estimates the background sky signal by performing a morphological closing with a large polygonal structuring element of radius half the size of the number of rows of the sky image. The processor then subtracts the original sky image from the background image to produce a background corrected image with a flat background. Secondly, the processor thresholds the background corrected image using a threshold value determined by the maximum value in a region centred in the middle of the background corrected image. Applying this threshold constitutes a first pass at masking the horizon and objects such as trees and buildings. Thirdly, the processor refines the mask by performing a marker guided watershed process. This process may comprise the processor seeding the image by assigning seeds representing what is known to be sky and horizon. For example, a sky seed is a morphologically eroded version of the thresholded image. The horizon seed may be the set of pixels with a distance greater than 1.08 times the height of the image, from the centre of the image. The watershed operation may also require a gradient image which represents a border between the two classes of masking, i.e. sky and horizon, and guides how unallocated pixels (those not belonging to either sky or horizon) are allocated to the two classes. The gradient may be the difference between a morphological dilation of the original sky image with a square structuring element of size 5×5 pixels and the original sky image itself. The processor may determine the result of the watershed to be the mask for the respective frame.

Figure 25:
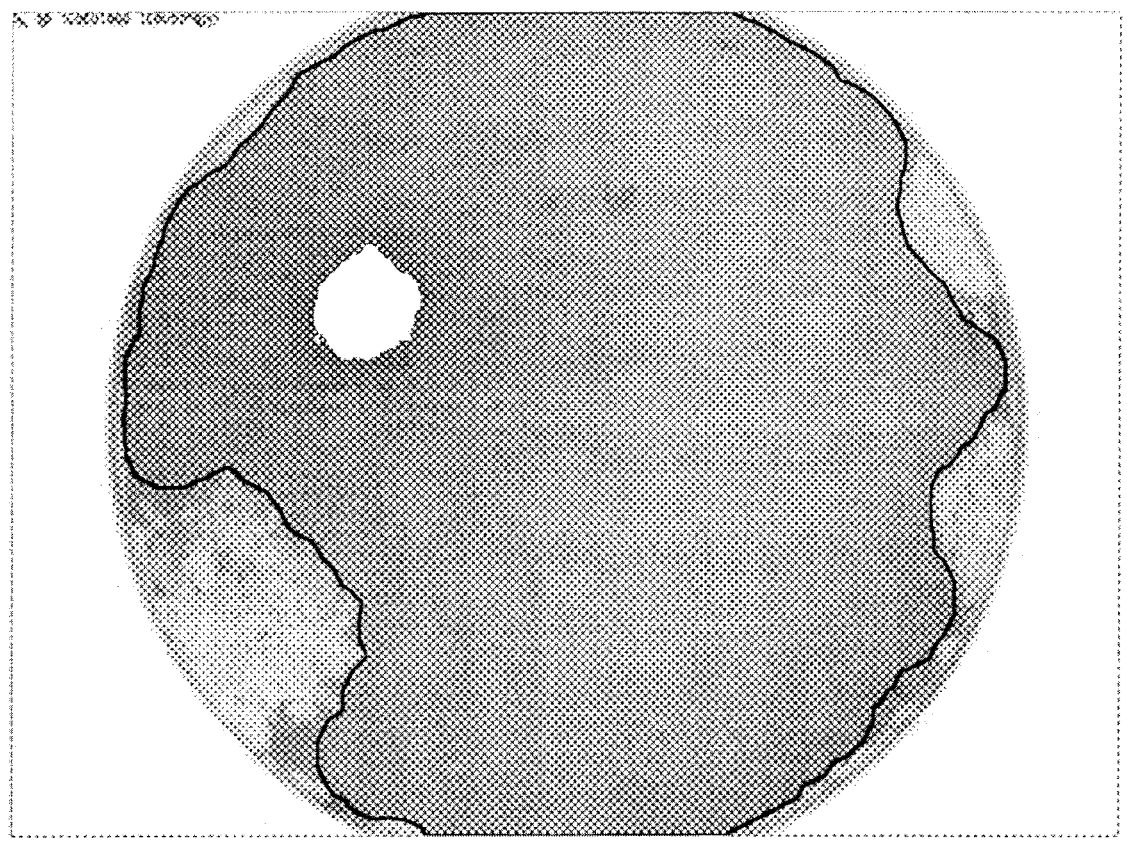
FIG. 25 illustrates an example masking of a horizon and ground objects.

There are two main issues that may impact on the accuracy of the resulting mask. The first is the contrast of the image between the sky and the horizon, building and trees. The second is the presence of clouds. The processor may address the first issue by restricting analyses to frames from early morning and late afternoon. This will allow the shadow on the sides of the building and trees to reliably renders them as darker than the sky. In one example, the frames analysed for masking are from the first and last hour of capturing sky images on each day and sampled at 1 minute intervals. The presence of clouds at this time of day are problematic as they are often darker than the sky and are hence misclassified as horizon. Because the processor calculates the masks from many images each day and the clouds move, the masks vary when there is cloud presence impacting on the mask. The processor may calculate the amount of times each pixel appears in each of these masks, flag when this is variable, and exclude the day's mask if this varies by more than a threshold, for example, because of cloud presence. An example mask is shown in FIG. 25.

It will be appreciated by persons skilled in the art that numerous variations and/or modifications may be made to the specific embodiments without departing from the scope as defined in the claims.

It should be understood that the techniques of the present disclosure might be implemented using a variety of technologies. For example, the methods described herein may be implemented by a series of computer executable instructions residing on a suitable computer readable medium. Suitable computer readable media may include volatile (e.g. RAM) and/or non-volatile (e.g. ROM, disk) memory, carrier waves and transmission media. Exemplary carrier waves may take the form of electrical, electromagnetic or optical signals conveying digital data steams along a local network or a publically accessible network such as the internet.

It should also be understood that, unless specifically stated otherwise as apparent from the following discussion, it is appreciated that throughout the description, discussions utilizing terms such as "estimating" or "processing" or "computing" or "calculating", "optimizing" or "determining" or "displaying" or "maximising" or the like, refer to the action and processes of a computer system, or similar electronic computing device, that processes and transforms data represented as physical (electronic) quantities within the computer system's registers and memories into other data similarly represented as physical quantities within the computer system memories or registers or other such information storage, transmission or display devices.

The present embodiments are, therefore, to be considered in all respects as illustrative and not restrictive.

The invention claimed is:

1. A method for determining a level of solar radiation at a point of interest (POI), the method comprising:
   capturing multiple sky images by a distributed network of digital cameras comprising multiple pairs or sets of digital cameras capturing sky images of a region of the sky;
   determining sun location parameters;
   generating a three-dimensional (3D) sky model based on the sky images, wherein generating the 3D sky model comprises:
      generating 3D object data based on the sky images to model one or more objects in the region of sky by generating a separate 3D model for each of the one or more objects based on the sky images captured by each pair or set of digital cameras,
         wherein at least one pair or set of the multiple pairs or sets of digital cameras is configured to capture a side view of the region of the sky, and
         generating the 3D object data comprises calculating a thickness of the one or more objects and determining a continuous 3D surface mesh of the one or more objects based on sky images captured from the at least one pair or set of digital cameras including the side view of the region of the sky,
         the 3D object data comprising information regarding (i) the thickness of the one or more objects and (ii) the continuous 3D surface mesh of the one or more objects; and
      generating position data to model a position of the one or more objects in the region of sky; and
   determining a level of solar radiation at the POI based on the position data, the sun location parameters and the 3D object data comprising the information regarding (i) the thickness of the one or more objects and (ii) the continuous 3D surface mesh of the one or more objects.

2. The method of claim 1, wherein determining a level of solar radiation at a POI comprises:
   computing a light path between the POI and a location of the sun based on the sun location parameters;
   determining if the one or more objects modelled in the 3D sky model occludes the light path; and
   determining the level of solar radiation at the POI based on a level of occlusion of the light path by the one or more objects.

3. The method of claim 1, wherein for each object amongst the one or more objects, the 3D object data comprises information regarding one or more of the following:
- a continuous 3D volumetric mesh of the object;
- a 3D shape of the object;
- a volume of the object;
- an optical depth of the object.

4. The method of claim 1, wherein the digital cameras in each pair or set of digital cameras are spaced by between 100 metres and 2 kilometres.

5. The method of claim 1, wherein each pair or set of digital cameras is spaced by between 2 and 20 kilometres from other pairs or sets of digital cameras in the distributed network of digital cameras.

6. The method of claim 1, wherein generating 3D object data comprises determining 3D information for each of the one or more objects based on sky images captured by multiple pairs or sets of digital cameras.

7. The method of claim 1,
wherein generating 3D object data comprises aligning the sky images based on the sun location parameters, or
wherein the digital cameras in the distributed network of digital cameras comprise wide-angle or fisheye lenses, and generating 3D object data comprises aligning the sky images by 3D rotating the sky images in a fish-eye space.

8. The method of claim 1, wherein
generating separate 3D models comprises generating separate 3D point clouds or 3D meshes based on the sky images captured by each pair or set of digital cameras,
generating 3D object data further comprises aligning and merging separate 3D models to generate the 3D sky model of the region of the sky, and
merging the separate 3D models comprises matching features between the separate 3D models.

9. The method of claim 1, wherein the separate 3D models are sparse models, and generating 3D object data comprises merging separate sparse models on demand to generate a surface patch for the region of sky between the POI and the sun.

10. The method of claim 1, wherein generating 3D object data further comprises resolving conflicting data in overlapping areas of the separate 3D models.

11. The method of claim 1, wherein
generating position data comprises determining a location and an altitude of a base of each of the one or more objects in the region of sky based on the sky images captured by multiple digital cameras in the distributed network of digital cameras,
generating position data comprises determining an altitude of each of the one or more objects based on a pixel-shift of each object between sky images, and
generating the 3D sky model comprises combining the position data and the 3D object data.

12. The method of claim 1, wherein:
generating the 3D sky model comprises
determining pixels in the sky images that are below a horizon,
masking the pixels in the sky images that are below the horizon,
determining pixels in the sky images that correspond to a fixed object, and
masking the pixels in the sky images that correspond to a fixed object; or
determining the sun location parameters comprises
storing the captured sky images,
determining the sun location parameters based on stored sky images captured at different times of a day, and
fitting a smoothed curve through sun location points determined from the sky images such that an error between the sun location points and a sun azimuth/zenith model of the sun's rotation is minimised.

13. The method of claim 1, wherein determining a level of solar radiation at the POI comprises:
estimating a future position of each of the one or more objects by extrapolating a past position, volume, optical depth and/or velocity of the object; and
forecasting a future level of solar radiation at the POI.

14. The method of claim 1, further comprising generating a control signal to control a solar power system based on the determined level of solar radiation at the POI,
wherein generating a control signal comprises one or more of:
generating a control signal to control an inverter output to adjust ramp-rates in an electrical grid;
controlling energy storage charge and discharge rates and timing;
controlling the rate and timing of energy consumption of electrical devices;
controlling electrical devices to provide voltage, frequency and network services to the electrical grid; and
controlling a generator to compensate for a reduction of performance caused by a cloud cover reducing level of solar radiation of the solar power system, and
wherein a number of sky images captured is such that an accuracy of the determined level of solar radiation is sufficient for generating a control signal that compensates for a difference between a power demand and a predicted solar power performance.

15. The method of claim 1, wherein capturing the sky images comprises capturing multiple images at different exposure parameters and combining the multiple images into a single sky image.

16. The method of claim 1, wherein each of the one or more objects is a cloud, and the method further comprises:
determining cloud formation and/or advection parameters based on the sky images; and
determining the level of solar radiation based on the cloud formation and/or advection parameters.

17. The method of claim 1, wherein determining a level of solar radiation at a point of interest (POI) is also based on one or more of the following:
satellite imagery;
numerical weather forecasts;
weather observations; and
measurements of distributed solar power generation.

18. A method for determining a network of digital cameras to estimate a performance of a solar power system, the method comprising:
performing the method of claim 1 to determine a predicted level of solar radiation;
determining a predicted performance of a solar power system based on the predicted level of solar radiation;
receiving measurement data indicative of the actual performance of the solar power system;
determining a difference between the predicted performance and the actual performance; and determining the network of digital cameras by reducing the difference between the predicted performance and the actual performance.

19. A method for determining a network of digital cameras to estimate a performance of a solar power system, the method comprising:
   determining a predicted level of solar radiation;
   determining a predicted performance of a solar power system based on the predicted level of solar radiation;
   receiving measurement data indicative of actual performance of the solar power system;
   determining a difference between the predicted performance and the actual performance; and
   determining the network of digital cameras, including determining the number and location of digital cameras that reduces the difference between the predicted performance and the actual performance.

20. A system comprising:
   a distributed network of digital cameras comprising multiple pairs or sets of digital cameras to capture multiple sky images of a region of the sky; and
   a processor to:
      receive multiple sky images from the distributed network of digital cameras;
      generate a three-dimensional (3D) sky model based on the sky images, wherein generating the 3D sky model comprises:
         generate 3D object data based on the sky images to model one or more objects in the region of sky by generating a separate 3D model for each of the one or more objects based on the sky images captured by each pair or set of digital cameras,
            wherein at least one pair or set of the multiple pairs or sets of digital cameras is configured to capture a side view of the region of the sky, and
            generating the 3D object data comprises calculating a thickness of the one or more objects and determining a continuous 3D surface mesh of the one or more objects based on sky images captured from the at least one pair or set of digital cameras including the side view of the region of the sky,
            the 3D object data comprising information regarding
               (i) the thickness of the one or more objects and
               (ii) the continuous 3D surface mesh of the one or more objects; and
      generate position data to model a position of the one or more objects in the region of sky;
      determine sun location parameters;
      determine a level of solar radiation at the POI based on the position data, the sun location parameters and the 3D object data comprising the information regarding (i) the thickness of the one or more objects and (ii) the continuous 3D surface mesh of the one or more objects.

* * * * *